United States Patent
Ashar et al.

(10) Patent No.: US 6,745,160 B1
(45) Date of Patent: Jun. 1, 2004

(54) VERIFICATION OF SCHEDULING IN THE PRESENCE OF LOOPS USING UNINTERPRETED SYMBOLIC SIMULATION

(75) Inventors: Pranav Ashar, Princeton, NJ (US); Anand Raghunathan, Plainsboro, NJ (US); Subhrajit Bhattacharya, Plainsboro, NJ (US); Aarti Gupta, Princeton, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/414,815

(22) Filed: Oct. 8, 1999

(51) Int. Cl.$^7$ .............................................. G06F 17/50
(52) U.S. Cl. .............................. 703/14; 703/13; 703/15; 703/16; 716/1; 716/8
(58) Field of Search ......................... 716/18, 1; 703/2, 703/14, 15, 16, 13; 714/807

(56) References Cited

U.S. PATENT DOCUMENTS

| | | | | |
|---|---|---|---|---|
| 5,452,239 A | * | 9/1995 | Dai et al. ..................... | 703/19 |
| 5,801,958 A | * | 9/1998 | Dangelo et al. .............. | 716/18 |
| 5,870,308 A | * | 2/1999 | Dangelo et al. .............. | 716/18 |
| 5,875,196 A | * | 2/1999 | Chakradhar et al. ........ | 371/22.1 |
| 6,163,876 A | * | 12/2000 | Ashar et al. ................. | 703/15 |
| 6,216,252 B1 | * | 4/2001 | Dangelo et al. .............. | 716/1 |
| 6,295,626 B1 | * | 9/2001 | Nair et al. ................... | 714/807 |
| 6,324,678 B1 | * | 11/2001 | Dangelo et al. .............. | 716/11 |

OTHER PUBLICATIONS

"Formal Verification in Hardware Design: A Survey", C. Kern, ACM Trans. On Design Automation of Electronic Systems, vol. 4 No. 2, Apr. 1999.*

"Automatic functional test generation using the extended finite state machine model", K.T. Cheng, in Proc. Design Automation conf., Jun. 1993.*

"Incorporating speculative execution into scheduling for control–flow intensive behaviors", G. Lakshinarayana, in Proc. Design Automation conf., Jun. 1998.*

"Formal Verification in Hardware Design: A Survey", C. Kern, ACM Trans. On Design Automation of Electronic Systems, vol. No. 2, Apr. 1999.*

"Automatic functional test generation using the extended finite state machine model", K.T. Cheng, in Proc. Design Automation conf., Jun. 1993.*

"Incorporating speculative execution into scheduling for control–flow intensive behaviors", G. Lakshinarayana, in Proc. Design Automation conf., Jun. 1998.*

"Verification of Scheduling in the Presence of Loops Using Uniterpreted Symbolic Simulation", P. Ashar, Technical Report, C&C Research Labs. NEC USA, Oct. 16, 1998.*

Chih–Tung Chen, et al., "A hybrid Numeric/Symbolic Program for Checking Functional and Timing Compatibility of Synthesized Designs," Technical Report Ceng, Univ. of Southern California, pp. 112–117, 1994.

D. Lewin, et al., "A Methodology for Processor Implementation Verification," In Proceedings of the Int. Conf. on Formal Methods in CAD, pp. 126–142, Nov. 1996.

Robert E. Shostak, "An Algorithm for Reasoning About Equality," Communications of the ACM, vol. 21, No. 7, pp. 583–585, Jul. 1978.

(List continued on next page.)

*Primary Examiner*—Hugh Jones
*Assistant Examiner*—Fred Ferris
(74) *Attorney, Agent, or Firm*—Sughrue Mion, PLLC

(57) ABSTRACT

A method of checking correctness of scheduling of a circuit where a schedule for the circuit is obtained from a behavioral description. The method comprising extracting loop invariants to determine a sufficient set of acyclic threads when loops are present, performing symbolic simulation to extract the above loop invariants, and proving equivalence of the acyclic threads. Systems, computer systems and computer program products that incorporate the techniques of verification and correctness checking according to the present invention have also been disclosed.

33 Claims, 18 Drawing Sheets

OTHER PUBLICATIONS

R. C. Ho, et al. "Architecture Validation for Processors," In Proceedings of the 22$^{nd}$ Annual Intl. Symposium on Computer Architecture, Jun. 1995.

K. Cheng, et al., "Automatic Functional Test Generation Using the Extended Finite State Machine Model," In Proceedings of the 30$^{th}$ ACM/IEEE Design Automation Conf., pp. 86–91, Jun. 1993.

Yatin V. Hoskote, et al., "Automatic Extraction of the Control Flow Machine and Application to Evaluating Coverage of Verification Vectors," Technical Report Ceng, Univ. of Texas at Austin, pp. 532–537, 1995.

H. Iwashita, et al., "Automatic Test Program Generation for Pipelined Processors," In Proceedings of the IEEE Intl. Conf. on Computer Design, pp. 580–583, Oct. 1994.

A. K. Chandra, et al., "Avpgen—A Test Case Generator for Architecture Verification," IEEE Transactions on VLSI Systems, 6(6), Jun. 1995.

R. Gupta, et al., "Ballast: A Methodology for Partial Scan Design," In Proceedings of the Intl. Symposium on Fault Tolerant Computing, pp. 118–125, Jun. 1989.

D. Knapp, et al., "Behavioral Synthesis Methodology for HDL–Based Specification and Validation," 32nd Design Automation Conf., pp. 286–291, 1995.

F. Brglez, et al., "Combinational Profiles of Sequential Benchmark Circuits," In Proceedings of the International Symposium on Circuits and Systems, Portland, Oregon, May 1989.

D. Geist, et al., "Coverage–Directed Test Generation Using Symbolic Techniques," In Proceedings of the Int. Conf. on Formal Methods in CAD, pp. 143–158, Nov. 1996.

Robert B. Jones, et al., "Efficient Validity Checking for Processor Verification," pp. 2–6, IEEE, 1995.

Ivan Radivojevic, et al., "Ensemble Representation and Techniques for Exact Control–Dependent Scheduling," pp. 60–65, IEEE, 1994.

P. Wolper, "Expressing Interesting Properties of Programs in Propositional Temporal Logic," In Proceedings of the 13$^{th}$ Annual ACM Symposium on Principles of Programming Languages, pp. 184–192, ACM, NY, Jan. 1986.

Anton T. Dahbura, "Formal Methods for Generating Protocol Conformance Test Sequences," Proceedings of the IEEE, vol. 70, No. 8, pp. 1317–1326, Aug. 1990.

R. P. Kurshan, "Formal Verification in a Commercial Setting," In Proceedings of the ACM/IEEE Design Automation Conf., pp. 258–262, Jun. 1997.

Shin–ichi Minato, "Generation of BDDs from Hardware Algorithm Descriptions," ICCAD, pp. 1–6, IEEE, 1996.

Farzan Fallah, et al., "Functional Vector Generation for HDL Models Using Linear Programming and 3–Satisfiability," DAC, pp. 528–533, 1998.

H. J. Touati, et al., "Implicit State Enumeration of Finite State Machines Using BDDs," In Proceedings of the IEEE International Conf. on Computer–Aided Design, pp. 130–133, IEEE Computer Society Press, CA., 1990.

Ganesh Lakshminarayana, et al. "Incorporating Speculative Execution into Scheduling of Control–Flow Intensive Behavioral Descriptions," ACM, San Francisco, CA., pp. 108–113, 1998.

Reinaldo A. Bergamaschi, et al., "Observable Time Windows: Verifying High–Level Synthesis Results," IEEE Design and Test of Computers, IEEE, pp. 40–50, 1997.

J. Yuan, et al., "On Combining Formal and Informal Verification," In Proceedings of the Workshop on Computer–Aided Verification, vol. 1254 of Lecture Notes in Computer Science, pp. 376–387, NY, Jun. 1997.

Raul Camposano, "Path–Based Scheduling for Synthesis," IEEE Transactions on Computer–Aided Design, vol. 10, No. 1, pp. 85–93, Jan. 1991.

Roni Potasman, et al., "Percolation Based Synthesis," 27$^{th}$ ACM/IEEE Design Automation Conf., pp. 444–449, 1990.

Subhrajit Bhattacharya, "Performance Analysis and Optimization of Schedules for Conditional and Loop–Intensive Specifications," 31$^{st}$ DAC, pp. 491–496, 1994.

S. Owre, et al., "PVS: A Prototype Verification System," 11$^{th}$ Int'l. Conf. on Automated Deduction, NY, pp. 748–752; Jun. 1992.

S. Malik, et al., "Retiming and Resynthesis: Optimizing Sequential Networks with Combinational Techniques," IEEE Transactions on Computer Aided Design of Integrated Circuits and Systems, 10(1):74–84, Jan. 1991.

Charles E. Leiserson, et al., "Retiming Synchronous Circuitry," Algorithmica, 6(1):5–36, 1991.

E. M. Sentovich, et al., "Sequential Circuit Design Using Synthesis and Optimization," In Proceedings of the IEEE Int'l. Conf. on Computer Design, 1992.

A. Balakrishnan, et al., "Software transformations for Sequential Test Generation," In Fourth Asian Test Symposium, pp. 266–272, 1995.

J. R. Burch, et al., "Symbolic Model Checking for Sequential Circuit Verification," IEEE Transactions on Computer–Aided Design, 13(4):401–424, Apr. 1994.

Wayne Wolf, et al., "The Princeton University Behavioral Synthesis System," 29$^{th}$ ACM/IEEE Design Automation Conf., pp. 182–187, 1992.

A. Gupta, et al., "Toward Formalizing a Validation Methodology Using Simulation Coverage," IN Proceedings of the 34$^{th}$ ACM/IEEE Design Automation Conf., pp. 740–745, Jun. 1997.

Pranav Ashar, et al., "Verification of RTL Generated from Scheduled Behavior in a High–Level Synthesis Flow," ICCAD, pp. 517–524, 1998.

R. C. Ho, et al., "Validation Coverage Analysis for Complex Digital Designs," In Proceedings of the IEEE Int'l. Conf. on Computer–Aided Design, pp. 146–151, Nov. 1996.

O. Coudert, "Verification of Sequential Machines Using Boolean Functional Vectors," In L. M. J. Claesen, Editor, Proceedings of the IFIP International Workshop on Applied Formal Methods for Correct VLSI Design, Belgium, 1989, vol. II, pp. 179–196, Amsterdam, 1989.

0 in Design Automation. Directed Search. http://www.0–in.com/directed_search.html.

R. K. Brayton et al., "VIS: A System for Verification and Synthesis," Technical Report UCS/ERL M95, Electronics Research Lab, University of California, Dec. 1995.

* cited by examiner

```
P1 : process
   variable t6: integer;

begin
  x_var <= Xinport;
  dx_var <= DXport;
  y_var <= Yinport;
  u_var <= Uinport;
  wait for 0ns;
  wait until clk='1' and clk'event; -- CLOCK EDGE while (x_var < a_var) loop
    t6 := u_var - u_var * dx_var * x_var;
    u_var <= t6 - dx_var * three * y_var;
    wait until clk='1' and clk'event;-- CLOCK EDGE
    y_var <= y_var + u_var * dx_var;
    x_var <= x_var + dx_var;
    wait for 0ns;
  end loop;

Xoutport <= x_var;
  Youtport <= y_var;
  Uoutport <= u_var;
end process P1;
```

FIG. 1

```
int TEST1 (int k1, int k2, int a, int b){
  int x1, x2, var1, var2, var3, var4, var5;
  x1 = 10;
  x2 = 0;
  for(int count = 0; count ≤ k1; count + +){
  // <= 1 and + + 1
    if (x1 < 100){//<1
      var1 = a + x1;//+1
      var2 = 5 + var1;//+2
      x1 = var2 x 3;//*1
    }
    else{
      var3 = a + x1; //+3
      x1 = var3 x 7;//*2
    }
  }
  for(int count1 = 0; count1 ≤ k2; count1 + +){
  //<=2 and ++2
    var5 = b + x2;//+4
    x2=6 x var5;//*3
  }
  return(x1 + x2);//+5
}
```

FIG. 2(a)

```
Procedure COMPARE_STRUCTURE_GRAPHS(SSG_T, BSG_T')
  Arr1:= DFS_SORT(BSG_T')
  Arr2:= DFS_SORT(SSG_T)
  Identify basis variables in BSG_T';
  Symbolic simulate BSG_T' to express non-basis vars in
    terms of basis vars;
  Construct equivalence lists for IN nodes in SSG_T;
  For_each_element(Arr2, v) {
    switch(TYPE(v)) {
    case Mux:
      For each data input v_fanin of v {
        For each entry (u,c) in equivalence list of v_fanin
          ADD_EQUIVALENCE(v, u, c ∩ select_cond);
    case OP:
      Identify corresponding OP vertex u_op in BSG_T' such that
        (i) u_op and v perform the same operation, AND
        (ii) Inputs of v have conditional equivalences
          with corresponding inputs if u_op;
      cond=conjunction of conditions;
      if cond ≠ 0 {
        ADD_EQUIVALENCE(v, u_op, cond); }
    case LOGIC:
      convert input lists into BDD nodes and propagate;
    case PO:
      If equivalence exists with corresponding PO in BSG_T'
      and condition is 1
        continue;
      else
        return(Error); } }
  return(Equivalent);
```

FIG. 4

```
p = 0; q = 0; r = 0;
while (q < 10) {
    q = p + 1;
    p = r + 1;
    r = r + 1;
}
out = q;
```

Procedure COMPARE_STGs(*BSTG*, *SSTG*)
{
1. Identify SCCs in *SSTG*
2. Identify exit nodes in each SCC
3. Collapse nodes not in SCCs and
   nodes in SCCs that are not exit nodes
4. Foreach path from root to sink such that
      any exit point appears 0, 1, and 3 times {
//Through symbolic simulation,
//identify the corresponding path in the BSTG
5.    Obtain the structural RTL circuit (*SSG*) for the path -
      also returns cuts for the begin and end of each SCC
6.    Add circuitry to *SSG* to generate *Pathsignal*
7.    Constrained_symbolic_simulation (*BSTG*, *SSG*, *Pathsignal*)
8.    Foreach SCC in the path in order from root {
9.       *corresp_set_list* = return_loop_invariants(*ssg_cuts* 1,2 and 3)
10.      Foreach *corresp_set* in *corresp_set_list* {
11.         If (*corresp_set* is smaller than the correspondence set
             associated with *ssg_cut* 1) {
12.            Redo symbolic simulation from the third cut
               using only the *corresp_set*
            }
13.         Cofactor output equivalence conditions with path condition
14.         If resulting output equivalence is not unconditional {
15.            return not equivalent
            }
         }
      }
   }
16. return equivalent
}

FIG. 7

Procedure CONSTRAINED_SYMBOLIC_SIMULATION(*BSTG*, *SSG*, *Pathsignal*)
{
1. Permissible_Paths = Begin state in *BSTG*
2. do {
3.   Foreach unvisited state $S_i$ in Permissible_Paths {
4.     *BSG* = Generate_Structural_RTL(*BSTG*, Permissible_Paths)
5.     Uninterpreted_Symbolic_Simulation(*SSG*, *BSG*)
6.     Foreach outgoing transition $S_i \rightarrow S_j$ {
7.       If conjunction of transition condition and *Pathsignal* is not 0 {
8.         Add new copy $S_j$ to Permissible_Paths
        }
      }
    }
9. } until (the only unvisited states in Permissible_Paths are instances of the END state)
}

FIG. 8

Procedure RETURN_LOOP_INVARIANTS(ssg_cuts 1,2 and 3)
{
1. bsg_cuts = cuts in BSG corresponding to ssg_cuts
2. Derive the two subcircuits between bsg_cuts 1, 2 and 3
3. Check that these subcircuits are isomorphic
4. If not isomorphic, return corresp_set_list = {NULL}
5. $corresp\_set_n$ = correspondences associated with bsg_cut_2
6. $corresp\_set_{n+1}$ = correspondences associated with bsg_cut_3
7. while ($corresp\_set_n \neq corresp\_set_{n+1}$) {
8.   if $corresp\_set_{n+1}$ is a subset of $corresp\_set_n$ {
9.     $corresp\_set\_list = corresp\_set\_list \cup corresp\_set_{n+1}$
    }
10.   $corresp\_set_n = corresp\_set_{n+1}$
11.   propagate $corresp\_set_n$ forward for one loop iteration
    by symbolic simulation
  }
12. $corresp\_set\_list = corresp\_set\_list \cup corresp\_set_{n+1}$
13. remove all entries in corresp_set_list that are supersets of
    other entries;
14. return corresp_set_list
}

FIG. 9

VERIFICATION OF SCHEDULING IN THE PRESENCE OF LOOPS USING UNINTERPRETED SYMBOLIC SIMULATION

1. DESCRIPTION OF THE INVENTION

1.1. Field of the Invention

The present invention is related to verification of scheduling steps in high-level synthesis. A key focus of this invention is a novel technique for verifying scheduling including all the typical transformations likely to be performed in conjunction with it. Specifically, the present invention provides a verification technique which can handle loops and a variety of loop transformations performed during scheduling.

1.2. Background of the Invention

The importance of synthesis from higher level specifications as a means to reduce the time to market circuits is well established. In addition to allowing faster synthesis, it also leads to greater reuse. Just as combinational logic verification by means of tools from Chrysalis®, Synopsys® and many other companies is necessary to validate the final logic netlist against an initial netlist specification, tools are also necessary to validate an RT level netlist obtained from a high level behavioral description. The present invention is geared toward providing improved techniques to perform validation. It is now well established that simulation by itself cannot be sufficient as a validation strategy since it is time consuming without guaranteeing correctness. Hence, a formal verification methodology is required.

Given the scope of transformations applied to realize the final RTL from an initial behavioral specification, a black box verification system that just takes as input the descriptions at the two widely disparate levels is, for all practical purposes, unviable. Fortunately, whether the synthesis itself is done using automatic tools or manually, it generally follows a common basic flow consisting of clearly demarcated fundamental steps like scheduling, resource allocation and register assignment. For a validation methodology to be practical, it must leverage off the knowledge of this flow. In fact, it can be argued that keeping the demarcation between steps like scheduling and register assignment intact is a good "design-for-verification" strategy. At the expense of some quality of the final design, the synthesis process becomes much easier to verify.

While it is easier than verifying the entire synthesis process, the verification of the individual steps in a high-level synthesis flow is by no means straightforward. Scheduling is the task of assigning time stamps to operations. In a synchronous design, this is performed by associating operations with states. In order to meet the various design requirements, transformations like operation reordering, loop unrolling, speculative execution etc. may be carried out during this step. A minimum requirement for a verification tool claiming to check scheduling is to include these transformations in its scope.

In the present disclosure, symbolic simulation implies a procedure that propagates variables rather than variable values forward through a circuit. The term "uninterpreted", in this context means that when complex operations like the standard arithmetic operations are encountered, the input list and the operation name are forwarded rather than the value of a Boolean function of the inputs.

1.2.1. Related Work

Several conventional techniques have been proposed for verifying designs generated from high-level descriptions. Considerable activity on symbolic simulation for program and hardware verification took place in the seventies and eighties. For a key representative, see J. Darringer, "The application of program verification techniques to hardware verification," in *Proc. Design Automation Conf*, pp. 375–381, June 1979. However, the work by Darringer and its derivatives have limited application in the context of verifying scheduling. Some of the derivative work can be found in W. Cory, "Symbolic simulation for functional verification with ADLIB and SDL," in *Proc. Design Automation Conf*, pp. 82–89, June 1981. and V. Pitchumani and E. Stabler, "A formal method for computer design verification," in *Proc. Design Automation Conf.*, pp. 809–814, June 1982.

Importantly, the main limitation of Darringer's work was that it required the user to provide invariants for the symbolic simulator to perform checking. It is known that in practice, when comparing two hardware descriptions, invariants are the correspondence points (control points in Darringer's terminology) at which the complete state of one description must match the state of the other. In the context of scheduling, the user needs to have detailed knowledge of, for example, the loop transformations carried out by the synthesis tool in order to provide this information to the simulator. Such a requirement is hard. Further, such a requirement would partly defeat the purpose of the verification. Also, with a user providing the correspondence points, the issue of completeness remains unresolved. The same basic algorithm with the added ability to detect and utilize correspondences among intermediate signals between control points to simplify the expressions to be checked for isomorphism at the control points was proposed in C.-T. Chen and A. Parker, "A hybrid numeric/symbolic program for checking functional and timing compatibility of synthesized designs," in *Proc. The International Symposium on High-Level Synthesis*, pp. 112–117, May 1994.

A few other related references have also been discussed herein. Minato proposed a Binary Decision Diagram (BDD) based approach for establishing equivalence between two hardware descriptions. See S. Minato, "Generation of BDDs from hardware algorithm descriptions," in *Proc. Int. Conf Computer-Aided Design*, pp. 644–649, November. 1996. In this approach, all conditional branching are converted to straight line code by the use of additional variables. Further, loops are handled by unrolling each loop until the BDDs for all variables stop changing with additional unrolling. Two descriptions are deemed equivalent if their BDDs are equivalent. This method suffers from the limitations of BDDs in representing arithmetic functions, and from the need to explicitly unroll loops until the loop exit condition is satisfied. Gong et al. proposed a set of rule suites for checking the various steps in high-level synthesis. See J. Gong, C. T. Chen, and K. Kucukcakar, "Multi-dimensional rule checking for high-level design verification," in *Proc. int. High-level Design Validation & Test Wkshp.*, November. 1997. However, their equivalence checker was limited to checking structural isomorphism. The contribution of Bergamaschi and Raje was to show how equivalence checking could be performed when corresponding signals in the two descriptions must be observed at different time points. See R. A. Bergamaschi and S. Raje, "Observable time windows: Verifying high-level synthesis results," *IEEE Design & Test of Computers*, vol. 8, pp. 40–50, April. 1997.

A number of techniques have been proposed recently for modeling arithmetic and control arithmetic interactions in the context of verification. See K. T. Cheng and A. S. Krishnakumar, "Automatic functional test generation using the extended finite state machine model," in *Proc. Design Automation Conf*, June 1993; and F. Fallah, S. Devadas, and K. Keutzer, "Functional vector generation for HDL models using linear programming and 3-satisfiability," in *Proc. Design Automation Conf*, June 1998 and J. Kukula, T. Shiple, and A. Aziz, "Implicit state enumeration for FSMs with datapaths," in *Proc. Formal Methods in Computer Aided Design*, November. 1998. These techniques are powerful and have potential future application in conjunction with model checking techniques or theorem proving in the verification of designs generated from high-level synthesis. J. R. Burch, E. M. Clarke, D. E. Long, K. L. McMillan, and D. L. Dill, "Symbolic model checking for sequential circuit verification," *IEEE Transactions on Computer-Aided Design*, vol. 13, April. 1994; R. K. Brayton et al., "VIS: A system for verification and synthesis," in *Proc. int. Conf Computer-Aided Verification*, July 1996; and S. Owre, J. M. Rushby, and N. Shankar, "PVS: A prototype verification system," in 11th international Conference on Automated Deduction (D. Kapur, ed.), vol. 607 of *Lecture Notes in Artificial Intelligence*, Springer Verlag, 1992; However, these techniques are also not powerful enough to avoid context specific assumptions about the transformations being performed during high-level synthesis.

A number of papers have been published over the years addressing the efficiency of the basic algorithm for symbolic simulation based equivalence checking with uninterpreted functions. See R. Shostak, "An algorithm for reasoning about equality," *Communications of the ACM*, vol. 21, no. 7, pp. 583–585, 1978, R. Jones, D. Dill, and J. Burch, "Efficient validity checking for processor validation," in *Proc. int. Conf Computer-Aided Design*, pp. 2–6, November. 1995; and A. Goel, K. Sajid, H. Thou, A. Aziz, and V. Singhal, "BDD based procedures for a theory of equality with unonterpreted functions," in *Proc. int. Conf Computer-Aided Verification*, pp. 244–255, July 1998. The symbolic simulation algorithm used in the present invention has some common features with conventional techniques. Its decision procedure includes Boolean as well as arithmetic operations. See C. Barrett, D. Dill, and J. Levitt, "Validity checking for combinations of theories with equality," in *Proc. Formal Methods in Computer Aided Design*, pp. 187–20, Nov. 1, 1996; and A. Goel, K. Sajid, H. Thou, A. Aziz, and V. Singhal, "BDD based procedures for a theory of equality with unonterpreted functions," in *Proc. int. Conf Computer-Aided Verification*, pp. 244–255, July 1998. It is also possible to add additional algebras to the decision procedure on demand. See C. Barrett, D. Dill, and 1. Levitt, "Validity checking for combinations of theories with equality," in *Proc. Formal Methods in Computer Aided Design*, pp. 187–20, Nov. 1, 1996.

However, it differs from conventional techniques in how Boolean operations/conditionals are handled. It is closest to A. Goel et al, with differences in the bookkeeping required to remember corresponding signals. See A. Goel, K. Sajid, H. Thou, A. Aziz, and V. Singhal, "BDD based procedures for a theory of equality with unonterpreted functions," in *Proc. int. Conf Computer-Aided Verification*, pp. 244–255, July 1998.

1.2.2. Background: Scope of Scheduling

Scheduling is one of the most important steps in a high-level synthesis based design flow. For general information on scheduling, see D. D. Gajski, N. D. Dutt, A. C.-H. Wu, and S. Y.-L. Lin, *High-level Synthesis: Introduction to Chip and System Design*. Kluwer Academic Publishers, Norwell, Mass., 1992; and G. De Micheli, *Synthesis and Optimization of Digital Circuits* McGraw-Hill, New York, N.Y., 1994. Starting from a behavioral description that contains partial or no timing information, the cycle-by-cycle behavior of the design is fixed during a scheduling step. In this sub-section, some of the typical transformations performed during the scheduling step are discussed. How the transformations add to the complexity of the verification process is also discussed herein.

1.2.2.1. Introducing Clock Cycle Boundaries.

Scheduling is a process of deriving a schedule from the behavioral description of a circuit. In a simple form of scheduling, the only transformation performed consists of placing clock cycle boundaries, or cuts, in the behavioral description. In the context of an HDL description, one possible equivalent is the insertion of several "wait until clk=1 and clk" event statements in the behavioral description. For details, see D. Knapp, T. Ly, D. MacMillen, and R. Miller, "Behavioral synthesis methodology for HDL-based specification and validation," in *Proc. Design Automation Conf*. pp. 28–291, June 1995. Because any sequence of operations between one cycle boundary and the next represents combinational logic, a set of cuts are typically placed to satisfy some conditions. For example, cuts are placed to break all loops (including implicit loops such as VHDL process statements or Verilog always blocks). It is known that the behavior and schedule are not equivalent on a cycle-by-cycle basis. Therefore, the notion of equivalence and techniques to check equivalence needs to operate across clock cycle boundaries. It is well known that the number of clock cycles required to compute the output may vary for different threads or input values. Further, the presence of (possibly data-dependent) loops also adds to the verification complexity. Additionally, because of the complex semantics of HDLs (such as signal assignments and concurrent statements) even the simple transformation of introducing cycle boundaries can change the design's functionality. This is clearly illustrated by the following example:

EXAMPLE 1

Consider the VHDL™ description shown in FIG. 1. The description relates to a process that contains a while loop, and various variable and signal assignment statements. Some of the steps involve arithmetic computations. The process has been annotated with two "wait until clk='1' and clk'" event statements. These event statements denote the clock cycle boundaries added during scheduling. Note that x_var, y_var, u_var and dx_var are signals, and all assignments made to these variables are signal assignments. The semantics of signal assignment statements in VHDL are such that the value to be assigned to the signal is computed instantaneously, but the assignment does not become effective until a later time. This time by default is equal to delta if no explicit time is specified. The purpose of the "wait for Ons;" statement is to introduce a delta delay, enforcing the new values generated by preceding signal assignment statements to become effective.

Consider the assignment to signal y_var inside the while loop in the behavioral description (note that the behavioral description does not contain any wait until clk='1' and clk' event statements). The computation of right hand side expression uses the old value of signal u_var, since the preceding assignment to signal u_var has been executed but is not effective until the "wait for Ons" statement at the end of the loop. However, in the schedule, the introduction of the wait until clk='1' and clk' event statement after the signal assignment to u_var enforces the new value of u_var to become effective before the assignment to y_var is evaluated. As a result of the above difference, the schedule may generate an erroneous value during simulation.

1.2.2.2. Re-ordering of Operations.

Re-ordering of operations may be performed during scheduling in order to exploit the parallelism present in the behavioral description, and to maximally utilize the given resources. In general, this could include re-ordering conditional operations and complete loops. State-of-the-art scheduling techniques often arbitrarily re-order the operations in the behavioral description while maintaining data-flow and memory access dependencies. For details, see D. D. Gajski, N. D. Dutt, A. C.-H. Wu, and S. Y.-L. Lin, High-level Synthesis: *Introduction to Chip and System Design*. Kluwer Academic Publishers, Norwell, Mass., 1992 and G. De Micheli, *Synthesis and Optimization of Digital Circuits* McGraw-Hill, New York, N.Y., 1994. Some of the possible errors that could be introduced during re-ordering of operations are violations of data dependencies, conditional control dependencies, and memory hazards (e.g. read-after-write, write-after-write, etc.). Verification of such schedules that are generated through re-ordering of operations requires extraction of control and data flow from the schedule. Further, they involve checking that the control and data dependencies are satisfied in the implementation (e.g., using structural isomorphism checking or rule checking techniques). For details, see J. Gong, C. T. Chen, and K. Kucukcakar, "Multi-dimensional rule checking for high-level design verification," in *Proc. int. High-level Design Validation & Test Wkshp.*, November. 1997).

EXAMPLE 2

Consider the behavioral C description and its corresponding schedule shown in FIG. 2. Since the behavior is specified as a sequential program, it defines a complete order on the operations executed for each thread. However, the scheduler may automatically perform an analysis of the dependencies between operations that must be preserved, and may choose to re-order operations when the order of operations does not matter to the computation of any output. Such re-ordering may be done to optimize the number of resources and/or clock period.

The following re-ordering operations have been performed in the schedule with respect to the behavior:

The order of operations marked +2 and *1 in the behavior has been reversed. This is an example of local re-ordering of operations within a basic block. This re-ordering is incorrect, because, there is a data dependency between operations +2 and *1 (the output of +2 is an input to *1) in the behavior, and the data dependency has been violated in the schedule shown in FIG. 2.

The order of execution of the two for loops has been reversed in the schedule. The loop that appears first in the behavior is implemented by states S2, S3, and S4 in the schedule, whereas the second for loop of the behavioral description is implemented in state S1 of the schedule. This re-ordering is valid, since there are no data dependencies or precedence constraints between the two loops (the only variable common to them, the loop counter count 1, is initialized to 0 before each loop).

1.2.2.3. Replication of Paths/Segments.

Different paths (or threads of computation) in a behavioral description often present distinct scheduling opportunities and constraints. Thus, in order to optimize a given path in the behavior maximally, it may be necessary to schedule the path (or parts thereof) separately from the remaining paths in the behavior. This results in the replication of paths or path segments in the schedule. Path-based scheduling techniques perform such optimizations for simple (acyclic) paths in the behavior. Similarly, loop-directed scheduling techniques automatically perform such optimizations for non-simple paths in the behavior. See R. Camposano, "Path-based scheduling for synthesis," *IEEE Trans. Computer-Aided Design*, vol. 10, pp. 85–93, January. 1991 and S. Bhattacharya, S. Dey, and F. Brglez, "Performance analysis and optimization of schedules for conditional and loop-intensive specifications," in *Proc. Design Automation Conf*, pp. 491–496, June 1994.

Replication of paths/segments during scheduling also increases the complexity of the verification process. It is known that the relationship between operations and variables is no longer one-to-one. Therefore, simple techniques that check for structural isomorphism are not sufficient to prove the equivalence of the schedule and the behavior. While replication results in an increased number of operations in the schedule with respect to the behavior, the behavior or set of operations performed along any one given path or thread in the behavior is the same. Thus, a conventional verification strategy is the enumeration of paths in the behavior and schedule. Further, for each pair of corresponding paths, such a strategy verifies that the set of operations performed in the behavior and schedule form an isomorphic data flow graph. For more details see C.-T. Chen and A. Parker, "A hybrid numeric/symbolic program for checking functional and timing compatibility of synthesized designs," in *Proc. The International Symposium on High-Level Synthesis*, pp. 112–117, May 1994.

1.2.2.4. Loop Transformations.

Loops often constitute the performance and/or power critical portions of a behavioral description. Numerous scheduling techniques have been proposed to aggressively optimize data-independent loops (loops whose execution count is known apriori, and is independent of the input values), as well as data dependent loops (loops whose execution count is not known statically and depends on input data). These include:

Loop unrolling. One meaning of loop unrolling is that a loop in the behavior is transformed to a certain number of copies of the loop body, followed by a copy of the loop. A second meaning is that one iteration of the loop in the schedule corresponds to multiple iterations of the loop in the behavior. Two flavors of loop unrolling transformations are illustrated in FIGS. 3(*b*) and 3(*c*).

Loop rotation. This results in the boundaries of a loop in the schedule being skewed with respect to the boundaries of the corresponding loop in the behavior. Loop rotation is illustrated in FIG. 3(*d*).

Loop pipelining. This is also called loop folding or loop winding, wherein multiple iterations of the loop body execute concurrently. It is sometimes necessary to also create a prologue and epilogue for ensuring correctness. For more details see R. Potasman, J. Lis, A. Nicolau, and D. Gajski, "Percolation based synthesis," in *Proc. Design Automation Conf*, pp. 444–449, June 1990. Loop pipelining is illustrated in FIG. 3(*e*).

The presence of loops in the behavior and the application of loop optimizations during scheduling makes verification significantly more complex. Specifically, the enumeration of threads or paths in the behavior and schedule needs to account for different execution counts of loops. Further, the number of times a loop is executed may be data dependent, and difficult to bound statically. Still further, even when such bounding is possible or the loop execution count is constant and known, the number of distinct paths in the behavior and schedule makes the enumeration of all such paths intractable. In addition, loop optimizations such as rotation and pipelining destroy correspondence between the boundaries of loops in the schedule and behavior. A key feature of the present invention is the automatic extraction of loop invariants that avoids enumeration of all non-simple paths in the schedule.

1.2.2.5. Speculative Execution.

During speculative execution, parts of the behavioral description are executed before it is known that they need to be executed. Speculative execution results in significant performance improvements when integrated into the scheduling step of high-level synthesis. However, speculative execution introduces additional complexities for verification. Importantly, control dependencies from the behavior are not satisfied in schedules that incorporate speculative execution. For more details, see I. Radivojevic and F. Brewer, "Ensemble representation and techniques for exact control-dependent scheduling," in *Proc. High-level Synthesis Workshop*, pp. 60–65, 1994 and 0. Lakshminarayana, A. Raghunathan, and N. K. Jha, "Incorporating speculative execution into scheduling for control-flow intensive behaviors," in *Proc. Design Automation Cont*, pp. 108–113, June 1998.

The scheduler typically introduces additional temporary variables in the schedule to store the results of speculatively executed operations. The scheduler also generates additional code (assignment statements) to resolve these temporary variables after the speculation conditions upon which they depend have been evaluated. Verification techniques based on structural isomorphism are not capable of verifying such transformations. This is explained in J. Gong, C. T. Chen, and K. Kucukcakar, "Multi-dimensional rule checking for high-level design verification," in *Proc. int. High-level Design Validation & Test Wkshp.*, November. 1997 and C.-T. Chen and A. Parker, "A hybrid numeric/symbolic program for checking functional and timing compatibility of synthesized designs," in *Proc. The International Symposium on High-Level Synthesis*, pp. 112–117, May 1994.

2. SUMMARY OF THE INVENTION

The present invention is centered on a novel uninterpreted symbolic simulation procedure. The techniques of the present invention determine whether, given the behavioral specification and the scheduled RTL, the outputs of the two descriptions correspond unconditionally to each other.

Starting with a list of possibly conditional input correspondences between the scheduled RTL and the behavioral description, the techniques of the present invention propagate conditional signal correspondences between signals in the two descriptions toward the outputs. The outputs of two operations correspond to each other if the operation types are identical and if the inputs to the operations correspond to each other under some condition. The condition under which the outputs correspond is then the conjunction of the conditions under which the inputs correspond.

Unlike arithmetic operations, Boolean operations are fully interpreted. This allows the checking of the correctness of transformations such as the movement of operations across conditionals. Such transformations are the norm in scheduling.

The task of verifying scheduling is complicated significantly by the presence of loops in the behavioral description and loop transformations during scheduling. A key aspect of the present invention is the efficient extraction of invariants in the form of correspondences between signals in the schedule and behavior by the equivalence checker, in the presence of loops and loop transformations in the scheduling context, without actually executing the loops to completion. The technique of the present invention is partly based on the observation that the state space explosion in most designs is caused by the data-path registers rather than the control states. Based on what are considered typical transformations in scheduling, the present technique is capable of verifying most designs generated by scheduling. The present technique is pessimistic in that if a loop optimization that it cannot handle is encountered, it will report a false negative. Details of the technique along with concrete examples of its application are provided in Section 4.

While the symbolic simulation algorithm is an important component of the present invention, it is not the primary contribution of this invention. A key contribution of the present invention is the augmentation of the basic symbolic simulation algorithm for acyclic graphs with the ability to handle loops.

To solve the problems in conventional methods it is an object of the present invention to provide an improved method of proving the equivalence of a schedule and its behavioral description. The present invention is not restricted to any schedule and can be used with a schedule that has been subject to any of the optimizations described in the background. It is to be noted that the optimizations discussed in the background are only illustrative and the present invention also covers schedules that have been subjected to other optimization techniques.

The behavior can be specified in any conventional form, including but not limited to a control flow graph, data flow graph or control/data flow graph (CDFG) and a behavioral (super-) state machine. For details on behavioral synthesis see D. Knapp, T. Ly, D. MacMillen, and R. Miller, "Behavioral synthesis methodology for HDL-based specification and validation," in *Proc. Design Automation Conf.* pp. 28–291, June 1995.

The present invention assumes that the correspondences between primary input variables in the behavior and schedule are given, and that the correspondences between the output variables and the times when they are expected to have identical values are clearly specified. The present invention handles behaviors and schedules that contain multiple, nested, and data-dependent loops.

The assumptions that need to be satisfied by the design and synthesis flow in order to guarantee accuracy and completeness of the verification procedure of the present invention are:

The operations in the behavioral description can be separated out into those which are treated as atomic entities during the scheduling process (e.g., arithmetic and comparison operations), and those which may be de-composed or transformed (e.g., Boolean operations). For example, a word or bit-vector operation (e.g. addition) may not be decomposed into its gate-level implementation during the scheduling process. The separation of operations into atomic and non-atomic operations may be arbitrary, but needs to be provided to the verification procedure. This information is used to decide which operations should be interpreted and which ones should be left uninterpreted by the uninterpreted symbolic simulation procedure, a key component of the verification technique of the present invention.

The scheduling process does not employ any knowledge derived from an interpretation of any of the atomic operations. For example, if arithmetic and comparison operations are declared to be atomic, it is assumed that scheduling does not use any knowledge about the functionality of these operations to optimize the schedule. Comparison operations include those used to determine branch and loop exit conditions.

For each loop in the behavior, there is at least one corresponding loop in the schedule, and one iteration of the loop in the schedule corresponds to one or more iterations of the loop in the behavior. Any schedule that does not satisfy this property is flagged off as erroneous by the verification procedure. Note that this assumption does not require that the loop bodies or boundaries be identical in the behavior and schedule. Rather, it implies that loop unrolling has only been performed from the behavior to the schedule and not vice-versa.

The above assumptions are not very restrictive, since they are satisfied by most practical scheduling techniques, including well known scheduling algorithms such as list scheduling, force-directed scheduling, path-based scheduling, loop-directed scheduling, etc. This is shown in D. D. Gajski, N. D. Dutt, A. C.-H. Wu, and S. Y.-L. Lin, *High-level Synthesis: Introduction to Chip and System Design*. Kluwer Academic Publishers, Norwell, Mass., 1992 and G. De Micheli, *Synthesis and Optimization of Digital Circuits*. McGraw-Hill, New York, N.Y., 1994.

In the present disclosure, the term typical scheduling technique is used to denote any scheduling algorithm or tool that satisfies the above assumptions.

In the context of checking correctness with loops, the approach of the present invention is to use loop invariants. However, the issue of loop termination is not specifically addressed, i.e. whether or not the code after the loop body is actually executed. In a sense, we consider termination after n iterations, for all $n \geq 0$, and check for equivalence in all cases. This aspect of the present approach needs to be highlighted—equivalence for all number of iterations of the loop body is checked. Note that due to the use of uninterpreted functions for handling arithmetic operations, it is not possible within this framework to account for termination conditions that depend upon interpreted values (whether or not they have been exploited by the scheduler). For example, suppose an error is exhibited only if a loop were executed 6 times, but due to the exit conditions the loop is never executed more than twice. In this case, the present procedure would report a false negative because the present invention considers not only termination after 2 iterations, but termination after all n iterations, including 6. The case where the loop iteration count has a constant upper bound is referred to as early termination.

To meet the objectives of the present invention there is provided a method of checking correctness of scheduling of a circuit where a schedule for the circuit is obtained from a behavioral description, the method comprising extracting loop invariants to determine a sufficient set of acyclic threads when loops are present in the circuit; performing symbolic simulation to extract the loop invariants; and proving equivalence of the acyclic threads.

Preferably, the behavioral description is transformed through introduction of cycle boundaries.

Preferably the behavioral description is transformed through operation reordering.

Preferably, the behavioral description is transformed through loop unrolling, winding, folding and pipelining.

Preferably, the behavioral description is transformed through speculative execution of operations.

Another aspect of the present invention is a method of verifying a schedule of a circuit against a behavioral description of the circuit, said method comprising: selecting a schedule thread of execution from said schedule where a thread may include loops; identifying a corresponding behavior thread from said behavioral description; proving unconditional equivalence of the schedule thread and the behavior thread; and repeating for all threads of execution.

Preferably the schedule is specified as a schedule state transition graph.

Preferably, the behavior is specified as a behavior state transition graph.

Preferably said proving unconditional equivalence further comprises: converting said schedule thread into a schedule structure graph and said behavior thread into a behavior structure graph; and checking equivalence of said schedule structure graph and said behavior structure graph.

Another aspect of the present invention is a method of verifying a schedule of a circuit against a behavioral description of the circuit, said method comprising: specifying the schedule as a schedule state transition graph; representing a behavior of the circuit as a behavioral state transition graph; selecting a schedule thread of execution from said schedule state transition graph; identifying a corresponding behavior thread from said behavioral state transition graph; converting said schedule thread into a schedule structure graph and said behavior thread into a behavior structure graph; checking equivalence of said schedule structure graph and said behavior structure graph; and repeating for all threads of execution.

Preferably, equivalence checking is done by a process comprising: creating ordered set arr1 containing all nodes in said behavior structure graph such that each node in said behavior state transition graph appears only after all nodes in the transitive fanin of said each node; creating ordered set arr2 containing all nodes in said schedule structure graph such that each node in said behavior structure graph appears only after all nodes in the transitive fanin of said each node; traversing arr1 and identifying basis variables in the behavior structure graph; expressing non-basis variables in the behavior structure graph in terms of basis variables; constructing equivalence lists for input nodes in the schedule structure graph; traversing arr2 and processing each node in arr2 to propagate equivalence lists from an input of the schedule structures graph to output of the schedule structure graph, wherein an entry in each of said equivalence lists is a pair (u,c) where u is an identifier for a signal in the behavior structure graph and c is a binary decision diagram representing a condition for equivalence; checking if an equivalence has been established with a corresponding out node in the behavior structure graph and if a corresponding condition c is a tautology for a primary output node in arr2; repeating for all output nodes in arr2; and finding equivalence if all output nodes are found to be equivalent.

Another aspect of the present invention is a method of verifying equivalence between a schedule of a circuit and a behavior of said circuit, wherein said schedule and said behavior could have cyclic threads of execution, said method comprising: representing the schedule as a schedule state transition graph; representing the behavior as a behavior state transition graph; identifying strongly connected components in the schedule state transition graph; identifying exit nodes in each of said strongly connected components; collapsing said schedule state transition graph to merge subpaths that do not pass through said strongly connected components; selecting a hitherto unselected path; obtaining a structural RTL circuit for the path selected; adding circuitry to the structural RTL circuit for generating a pathsignal encapsulating all state transition decisions required to enumerate the selected path; performing constrained symbolic simulation using the pathsignal to identify a corresponding path in behavior state transition graph, and obtaining a structural RTL circuit for said path; selecting a hitherto unselected strongly connected component in the selected path; extracting invariants for the selected strongly connected component in the selected path as a list of correspondence sets; selecting a correspondence set from the list of correspondence sets; redoing symbolic simulation if the selected correspondence set is smaller than a variable correspondence obtained at a strongly connected component cut of a prior symbolic simulation; repeating steps for each correspondence set in the list of correspondence sets; testing if an output equivalence condition is conditional on anything other than path conditions reporting non-equivalence and exiting this method if said output equivalence is conditional; repeating steps for all strongly connected components in the selected path; and repeating steps for all paths from a root to sink such that any exit point appears at most thrice;

Preferably, the unconstrained symbolic simulation is performed using a process comprising: assigning a begin state of the behavior state transition graph to a permissible paths list; selecting a hitherto unvisited state in the permissible paths list; generating a behavior structural RTL; performing uninterpreted symbolic simulation to identify corresponding signals in the schedule structural RTL and the behavior structural RTL; adding a new copy of state $S_j$ to permissible paths if a conjunction of transition condition and pathsignal is not zero; repeating v for each outgoing transition from $S_i$ to $S_j$; and repeating for all unvisited states until only unvisited states remaining in permissible paths list are instance of an end state.

Preferably, invariants are extracted from loops using a process comprising for each loop: identifying three cuts in the structural RTL circuit of the path in the schedule, wherein each cut represents variable values at the boundary of each iteration of the loop; identifying the corresponding cuts in the structural RTL circuit of the path in the behavior and checking that the subcircuits between the first and second, and second and third cuts are isomorphic; identifying equivalence relationships between variables at each pair of corresponding cuts in the schedule and behavioral RTL circuits; checking if the equivalence relationships between the latest and its previous cuts are identical; if the relationships are not identical, and if the equivalence relationship at the latest cut is a subset of the equivalence relationship at the previous cut, discarding the equivalence relationship at the previous cut, unroll the two RTL circuits for one more loop iteration and repeating; if the relationships are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeating; if the relationships are identical, adding the equivalence relationship at the latest cut to the set of equivalence relationship sets; removing all entries in the set of equivalence relationship sets that are supersets of other entries; designating the final set of equivalence relationship sets as the desired set of invariants.

Another aspect of the present invention is a system for checking correctness of scheduling of a circuit where a schedule for the circuit is obtained from a behavioral description, said system comprising: a loop invariants extractor to determine a sufficient set of acyclic thread when loops are present; a symbolic simulator to extract the above loop invariants; and an equivalence prover to prove equivalence of the acyclic threads.

Preferably, said behavioral description is transformed through introduction of cycle boundaries.

Preferably, said behavioral description is transformed through operation reordering.

Preferably, said behavioral description is transformed through loop unrolling, winding, folding and pipelining.

Preferably said behavioral description is transformed through speculative execution of operations.

Yet another aspect of the present invention is a system for verifying a schedule of a circuit against a behavioral description of the circuit, comprising: a schedule state transition graph generator for specifying the schedule as a schedule state transition graph; a behavior state transition graph generator for specifying the behavior of the circuit as a behavioral state transition graph; a schedule thread selector for selecting a schedule thread of execution from said schedule state transition graph; a behavior thread selector for selecting a corresponding behavior thread from said behavioral state transition graph; a convertor for converting said schedule thread into a schedule structure graph and said behavior thread into a behavior structure graph; and an equivalence checker for checking equivalence of said schedule structure graph and said behavior structure graph.

Still another aspect of the present invention is a computer system with a processor and memory for checking correctness of scheduling of a circuit where a schedule for the circuit is obtained from a behavioral description, said memory comprising instructions said instructions capable of enabling the computer to perform said checking, said instructions comprising: instructions for extracting loop invariants to determine a sufficient set of acyclic threads when loops are present; instructions for symbolic simulation to extract the loop invariants; and instructions to prove equivalence of the acyclic threads.

Preferably, said behavioral description is transformed through introduction of cycle boundaries.

Preferably, said behavioral description is transformed through operation reordering.

Preferably, said behavioral description is transformed through loop unrolling, winding, folding and pipelining.

Preferably, said behavioral description is transformed through speculative execution of operations.

Yet another aspect of the present invention is a computer system with a processor and memory for verifying a schedule of a circuit against a behavioral description of the circuit, said memory comprising instructions for enabling the computer to perform said verifying, said instructions comprising: instructions for specifying the schedule as a schedule state transition graph; instructions for representing a behavior of the circuit as a behavioral state transition graph; instructions for selecting a schedule thread of execution from said schedule state transition graph; instructions for selecting a corresponding behavior thread from said behavioral state transition graph; instructions for converting said schedule thread into a schedule structure graph and said behavior thread into a behavior structure graph; instructions for checking equivalence of said schedule structure graph and said behavior structure graph; and instructions for repeating through all threads of execution.

Still another aspect of the present invention is a computer system with a processor and memory for verifying a schedule of a circuit against a behavioral description of the circuit, said memory comprising instructions, said instructions enabling the computer to perform the following steps: specifying the schedule as a schedule state transition graph; representing a behavior of the circuit as a behavioral state transition graph; selecting a schedule thread of execution from said schedule state transition graph; identifying a corresponding behavior thread from said behavioral state transition graph; converting said schedule thread into a schedule structure graph and said behavior thread into a behavior structure graph; checking equivalence of said schedule structure graph and said behavior structure graph; and repeating steps for all threads of execution.

Preferably, said instructions further comprises instructions capable of enabling the computer to perform the following steps: creating ordered set arr1 containing all nodes in said behavior structure graph such that each node in said behavior state transition graph appears only after all nodes in the transitive fanin of said each node; creating ordered set arr2 containing all nodes in said schedule structure graph such that each node in said behavior structure graph appears only after all nodes in the transitive fanin of said each node; traversing arr1 and identifying basis variables in the behavior structure graph; expressing non-basis variables in the behavior structure graph in terms of basis variables; constructing equivalence lists for input nodes in the schedule structure graph; traversing arr2 and processing each node in arr2 to propagate equivalence lists from an input of the schedule structures graph to output of the schedule structure graph, wherein an entry in each of said equivalence lists is a pair (u,c) where u is an identifier for a signal in the behavior structure graph and c is a binary decision diagram representing a condition for equivalence; checking if an equivalence has been established with a corresponding out node in the behavior structure graph and if a corresponding condition c is a tautology for a primary output node in arr2; and repeating for all output nodes in arr2; and finding equivalence if all output nodes are found to be equivalent.

Yet another aspect of the present invention is a computer system with a processor and memory for verifying equivalence between a schedule of a circuit and a behavior of said circuit, wherein said schedule and said behavior could have cyclic threads of execution, said memory comprising instructions capable of enabling the computer to perform said verifying using the following steps: representing the schedule as a schedule state transition graph; representing the behavior as a behavior state transition graph; identifying strongly connected components in the schedule state transition graph; identifying exit nodes in each of said strongly connected components; collapsing said schedule state transition graph to merge subpaths that do not pass through said strongly connected components; selecting a hitherto unselected path; obtaining a structural RTL circuit for the path selected; adding circuitry to the structural RTL circuit for generating a pathsignal encapsulating all state transition decisions required to enumerate the selected path; performing constrained symbolic simulation using the pathsignal to identify a corresponding path in behavior state transition graph; selecting a hitherto unselected strongly connected component in the selected path; extracting invariants for the selected strongly connected component in the selected path as a list of correspondence sets; selecting a correspondence set from the list of correspondence sets; redoing symbolic simulation if the selected correspondence set is smaller than a variable correspondence obtained at a strongly connected component cut of a prior symbolic simulation; repeating steps for all correspondence set in the list of correspondence sets; testing if an output equivalence condition is conditional on anything other than path conditions reporting non-equivalence and exiting this method if said output equivalence is conditional; repeating steps for all strongly connected components in the selected path; and repeating steps for all paths from a root to sink such that any exit point appears at most thrice.

Preferably said instructions further comprises instructions capable of enabling the computer to perform the following steps: assigning a begin state of the behavior state transition graph to a permissible paths list; selecting a hitherto unvisited state in the permissible paths list; generating a behavior structural RTL; performing uninterpreted symbolic simulation to identify corresponding signals in the schedule structural RTL and the behavior structural RTL; adding a new copy of state $S_j$ to permissible paths if a conjunction of transition condition and pathsignal is not zero; repeating for each outgoing transition from $S_i$ to $S_j$; and repeating for all unvisited states until only unvisited states remaining in permissible paths list are instance of an end state.

Preferably said instructions further comprises instructions capable of enabling the computer to perform the following steps for each step: identifying three cuts in the structural RTL circuit of the path in the schedule, wherein each cut represents variable values at the boundary of each iteration of the loop; identifying the corresponding cuts in the structural RTL circuit of the path in the behavior and checking that the subcircuits between the first and second, and second and third cuts are isomorphic; identifying equivalence relationships between variables at each pair of corresponding cuts in the schedule and behavioral RTL circuits; checking if the equivalence relationships between the latest and its previous cuts are identical; if the relationships are not identical, and if the equivalence relationship at the latest cut is a subset of the equivalence relationship at the previous cut, discarding the equivalence relationship at the previous cut, unroll the two RTL circuits for one more loop iteration and repeating; if the relationships are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeating; if the relationships are identical, adding the equivalence relationship at the latest cut to the set of equivalence relationship sets; removing all entries in the set of equivalence relationship sets that are supersets of other entries; designating the final set of equivalence relationship sets as the desired set of invariants.

Another aspect of the present invention is a computer program product including a computer readable media comprising computer code capable of enabling a computer to check correctness of scheduling of a circuit, where a schedule for the circuit is obtained from a behavioral description, said computer code comprising: computer code for extracting loop invariants to determine a sufficient set of acyclic threads when loops are present; computer code for symbolic simulation to extract the loop invariants; and computer code to prove equivalence of the acyclic threads.

Preferably said behavioral description is transformed through introduction of cycle boundaries.

Preferably, said behavioral description is transformed through operation reordering.

Preferably, said behavioral description is transformed through loop unrolling, winding, folding and pipelining.

Preferably, said behavioral description is transformed through speculative execution of operations.

Yet another aspect of the present invention a computer program product including a computer readable media comprising computer code that capable of enabling a computer to verify a schedule of a circuit against a behavioral description of the circuit, said computer code comprising: a schedule state transition graph generator code for enabling the computer to specify the schedule as a schedule state transition graph; a behavior state transition graph generator code for enabling the computer to specify the behavior of the circuit as a behavioral state transition graph; a schedule thread selector code for enabling the computer to select a schedule thread of execution from said schedule state transition graph; a behavior thread selector code for enabling the computer to select a corresponding behavior thread from said behavioral state transition graph; a convertor code for enabling the computer to convert said schedule thread into a schedule structure graph and said behavior thread into a behavior structure graph; and an equivalence checker code for enabling the computer to check equivalence of said schedule structure graph and said behavior structure graph.

Yet another aspect of the present invention is a computer program product including a computer readable media comprising computer code that is capable of enabling a computer to verify a schedule of a circuit against a behavioral description of the circuit, said computer code enabling the computer to perform the following steps: specifying the schedule as a schedule state transition graph; representing a behavior of the circuit as a behavioral state transition graph; selecting a schedule thread of execution from said schedule state transition graph; identifying a corresponding behavior thread from said behavioral state transition graph; converting said schedule thread into a schedule structure graph and said behavior thread into a behavior structure graph; checking equivalence of said schedule structure graph and said behavior structure graph; and repeating for all threads of execution.

Preferably said computer code is capable of enabling the computer to perform the following steps: creating ordered set arr1 containing all nodes in said behavior structure graph such that each node in said behavior state transition graph appears only after all nodes in the transitive fanin of said each node; creating ordered set arr2 containing all nodes in said schedule structure graph such that each node in said behavior structure graph appears only after all nodes in the transitive fanin of said each node; traversing arr1 and identifying basis variables in the behavior structure graph; expressing non-basis variables in the behavior structure graph in terms of basis variables; constructing equivalence lists for input nodes in the schedule structure graph; traversing arr2 and processing each node in arr2 to propagate equivalence lists from an input of the schedule structures graph to output of the schedule structure graph, wherein an entry in each of said equivalence lists is a pair (u,c) where u is an identifier for a signal in the behavior structure graph and c is a binary decision diagram representing a condition for equivalence; checking if an equivalence has been established with a corresponding out node in the behavior structure graph and if a corresponding condition c is a tautology for a primary output node in arr2; and repeating for all output nodes in arr2; and finding equivalence if all output nodes are found to be equivalent.

Still another aspect of the present invention is a computer program product including a computer readable media comprising computer code that is capable of enabling a computer to verify a equivalence between a schedule of a circuit and a behavior of said circuit, wherein said schedule and said behavior could have cyclic threads of execution, said computer code enabling the computer to perform the following steps: representing the schedule as a schedule state transition graph; representing the behavior as a behavior state transition graph; identifying strongly connected components in the schedule state transition graph; identifying exit nodes in each of said strongly connected components; collapsing said schedule state transition graph to merge subpaths that do not pass through said strongly connected components; selecting a hitherto unselected path; obtaining a structural RTL circuit for the path selected; adding circuitry to the structural RTL circuit for generating a pathsignal encapsulating all state transition decisions required to enumerate the selected path; performing constrained symbolic simulation using the pathsignal to identify a corresponding path in behavior state transition graph, and obtaining a structural RTL circuit for said path; selecting a hitherto unselected strongly connected component in the selected path; extracting invariants for the selected strongly connected component in the selected path as a list of correspondence sets; selecting a correspondence set from the list of correspondence sets; redoing symbolic simulation if the selected correspondence set is smaller than a variable correspondence obtained at a strongly connected component cut of a prior symbolic simulation; repeating l-m for all correspondence set in the list of correspondence sets; testing if an output equivalence condition is conditional on anything other than path conditions; reporting non-equivalence and exiting this method if said output equivalence is conditional; repeating for all strongly connected components in the selected path; and repeating for all paths from a root to sink such that any exit point appears at most thrice.

Preferably the computer code is capable of enabling the computer to perform unconstrained symbolic simulation using the following steps: assigning a begin state of the behavior state transition graph to a permissible paths list; selecting a hitherto unvisited state in the permissible paths list; generating a behavior structural RTL; performing uninterpreted symbolic simulation to identify corresponding signals in the schedule structural RTL and the behavior structural RTL; adding a new copy of state $S_j$ to permissible paths if a conjunction of transition condition and pathsignal is not zero; repeating for each outgoing transition from $S_i$ to $S_j$; and repeating for all unvisited states until only unvisited states remaining in permissible paths list are instance of an end state.

Preferably, the computer code is capable of enabling the computer to extract invariants using the following steps for each loop: identifying three cuts in the structural RTL circuit of the path in the schedule, wherein each cut represents variable values at the boundary of each iteration of the loop; identifying the corresponding cuts in the structural RTL circuit of the path in the behavior and checking that the subcircuits between the first and second, and second and third cuts are isomorphic; identifying equivalence relationships between variables at each pair of corresponding cuts in the schedule and behavioral RTL circuits; checking if the equivalence relationships between the latest and its previous cuts are identical; if the relationships are not identical, and if the equivalence relationship at the latest cut is a subset of the equivalence relationship at the previous cut, discarding the equivalence relationship at the previous cut, unroll the two RTL circuits for one more loop iteration and repeating; if the relationships are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeating; if the relationships are identical, adding the equivalence relationship at the latest cut to the set of equivalence relationship sets; removing all entries in the set of equivalence relationship sets that are supersets of other entries; designating the final set of equivalence relationship sets as the desired set of invariants.

3. BRIEF DESCRIPTION OF THE DRAWINGS

The above objectives and advantages of the present invention will become more apparent by describing in detail preferred embodiments thereof with reference to the attached drawings in which:

FIG. 1 shows example of simple scheduling by inserting clock boundaries, and an error introduced.

FIGS. 2(a)–(b) show an example behavioral description of a circuit in C language and a corresponding schedule illustrating re-ordering of operations within and across basic blocks.

FIG. 3(a) shows an example behavioral description containing a loop.

FIGS. 3(b) & (c) show transformations involving loop unrolling.

FIGS. 3(d) & (e) show transformations involving loop rotation and loop pipelining respectively.

FIG. 4 shows pseudo-code for a preferred embodiment of a symbolic simulation algorithm for equivalence checking of structure graphs.

FIGS. 5(a) & (b) shows the process of extracting SCCs, collapsing the Acyclic Part and Enumerating Paths.

FIGS. 6 (a) & (b) show the behavior code and a schedule with bugs corresponding to the behavior code FIG. 7 shows pseudo-code depicting a preferred embodiment of the present invention for checking scheduling.

FIG. 8 shows pseudo-code for the application of symbolic simulation to find corresponding threads.

FIG. 9 shows pseudo-code depicting the extraction of invariants from loops.

FIGS. 10 (a) and (b) show behavior STG and Schedule STG that incorporates speculative execution for the spec_test1 example.

FIGS. 11 (a) and (b) show structure graphs for (a) schedule and (b) behavior for the spec_test1 example.

Figure 12A:
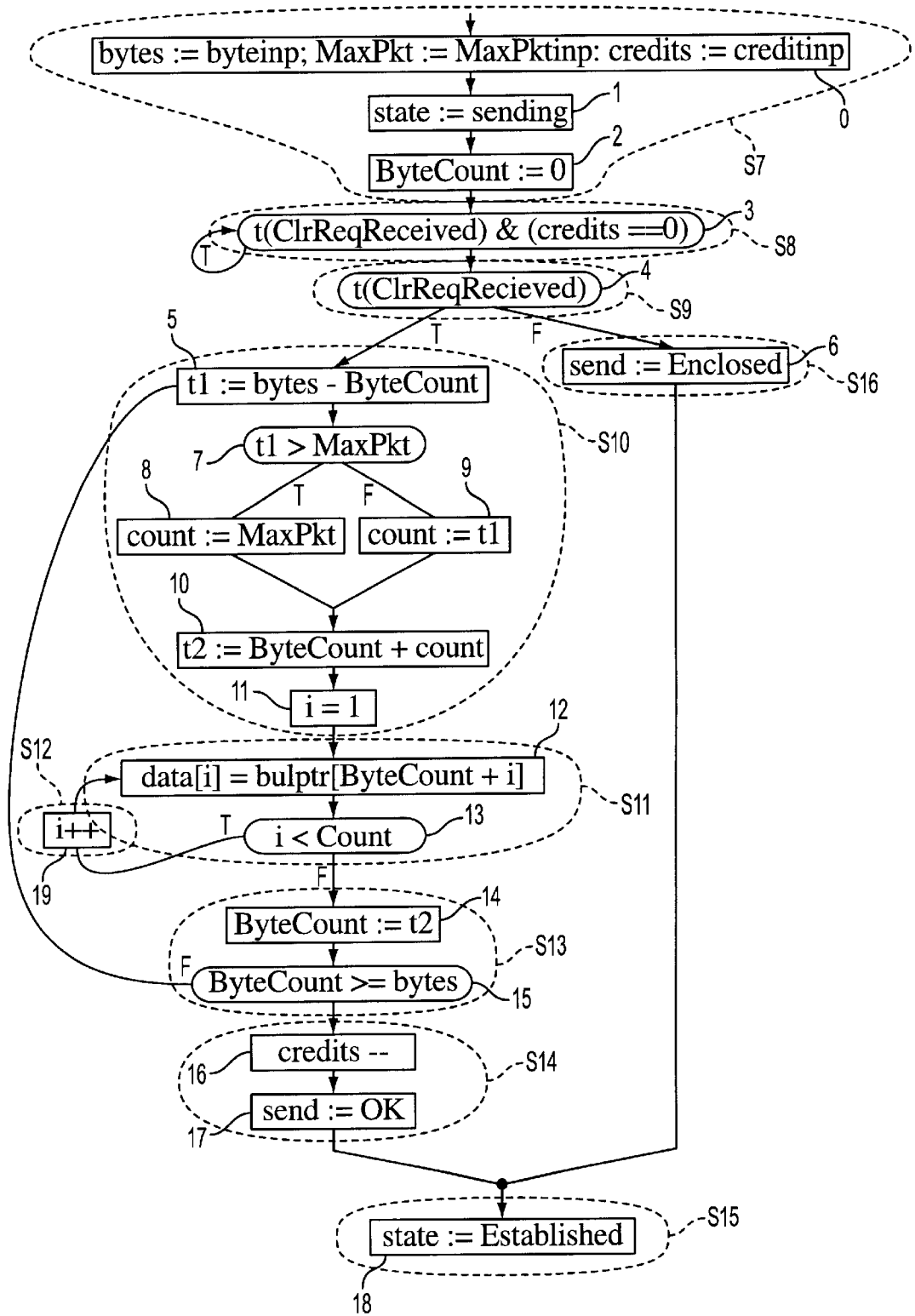
Figure 12C:
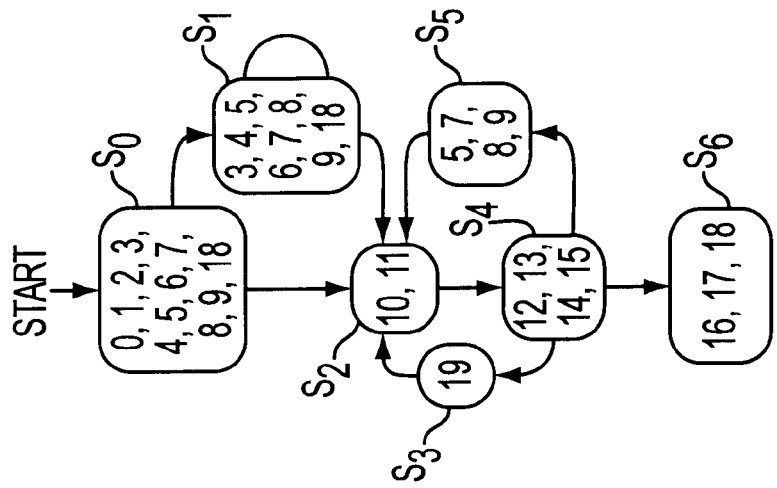
Figure 12B:
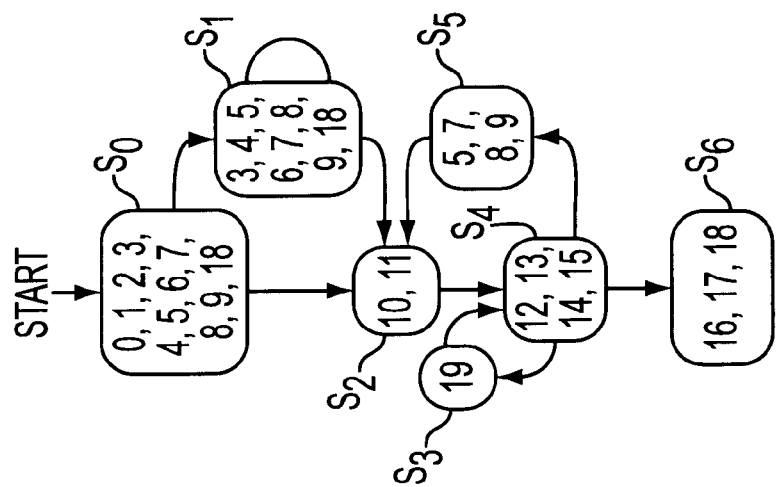

FIGS. 12 (a)–(c) show the send Process of the X25 Communications Protocol.

Figure 13B:
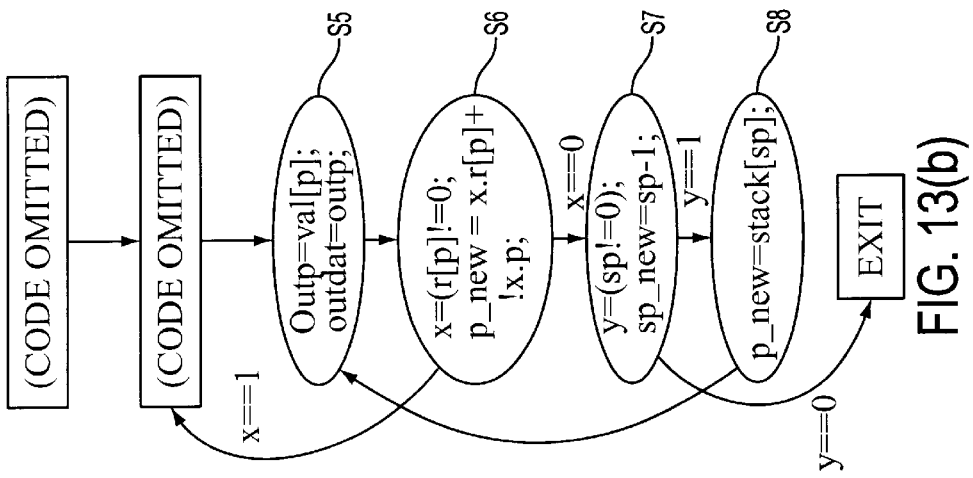
Figure 13A:
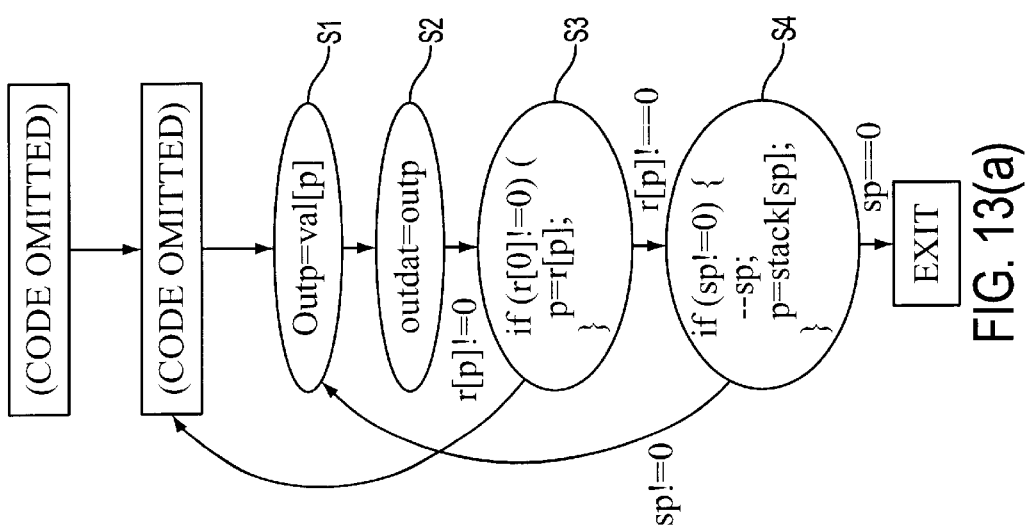

FIG. 13 (a) and (b) show a binary tree sort example.

Figure 14:
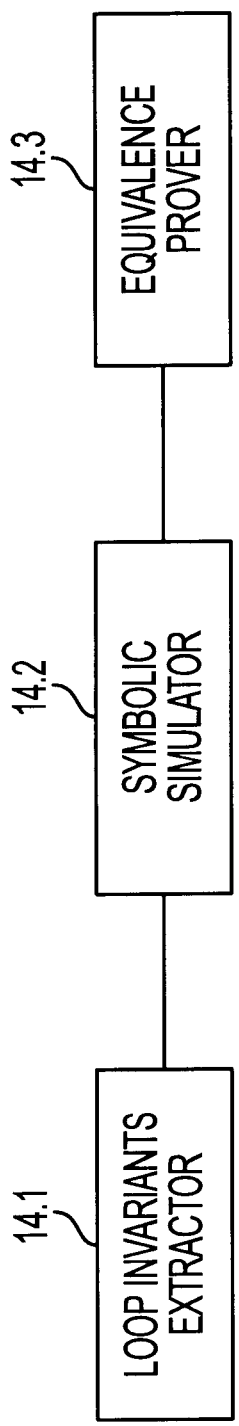

FIG. 14 shows a preferred embodiment of a system according to an aspect of the present invention.

Figure 15:
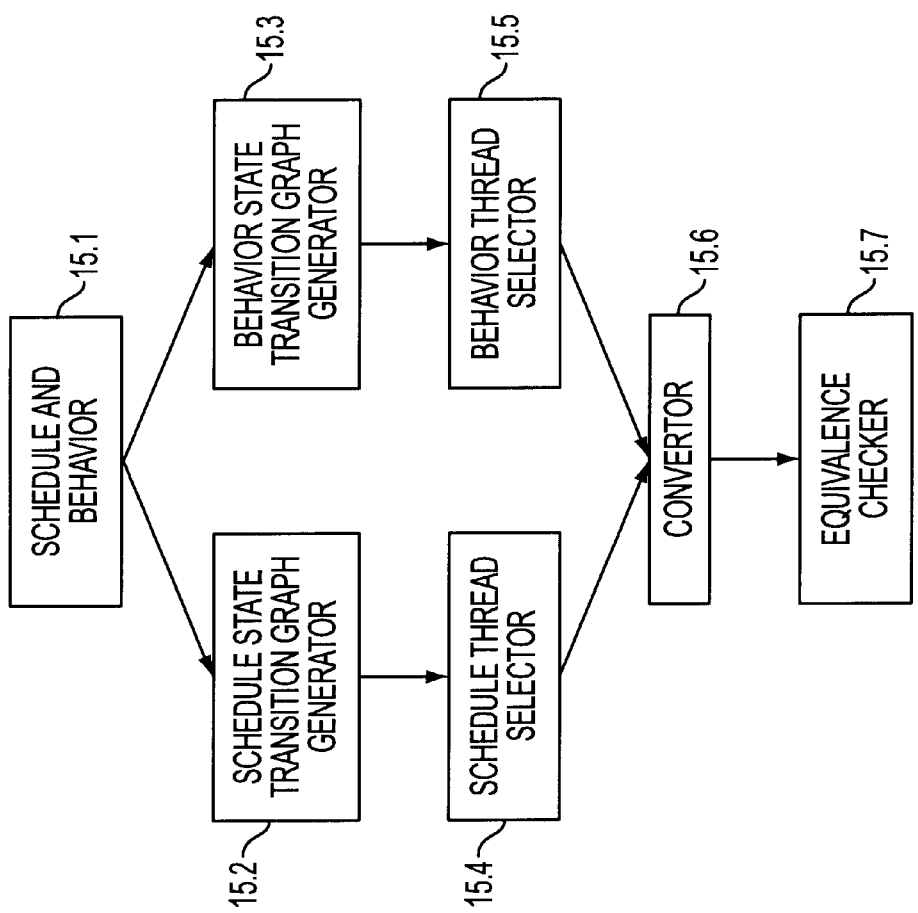

FIG. 15 shows a preferred embodiment of a system according to another aspect of the present invention.

4. DETAILED DESCRIPTION OF THE PREFERRED EMBODIMENTS

4.1. Symbolic Simulation with Uninterpreted Functions for an Acyclic Case

This sub-section (4.1) presents a preferred embodiment of an uninterpreted symbolic simulation algorithm, in the context of verifying a schedule against its behavioral description for schedules with finite-length acyclic threads. For all the explanations presented in this sub-section, only finite-length, acyclic threads in the schedule and behavior are compared.

The next sub-section (4.2) presents a preferred embodiment of a verification procedure that addresses the general case of comparing threads involving loops.

4.1.1. Representation of the Schedule.

In this preferred embodiment, the schedule is specified in the form of a (Schedule State Transition Graph) (or Schedule STG). A schedule STG is very similar to the Extended Finite State Machine (EFSM) and Behavioral Finite State Machine (BFSM) representations. For details on EFSM, see K. T. Cheng and A. S. Krishnakumar, "Automatic functional test generation using the extended finite state machine model," in *Proc. Design Automation Conf*, June 1993. For details on BFSM representation see O. Lakshminarayana, A. Raghunathan, and N. K. Jha, "Incorporating speculative execution into scheduling for control-flow intensive behaviors," in *Proc. Design Automation Conf*., pp. 108–113, June 1998. For details on FSM representation, see W. Wolf, A. Takach, C. Huang, and R. Mano, "The Princeton University behavioral synthesis system," in *Proc. Design Automation Conf*, pp. 182–187, June 1992. A schedule STG consists of a state transition graph, with functional RTL code embedded in each state.

The code embedded within state $S_i$ of the STG specifies the data path operations that need to be performed in $S_i$, and also computes the transition condition for each outgoing state transition from $S_i$. The code embedded within the states of the state transition graph can be defined in terms of variables V, and operations O, and clocks, the clocks governing the updating of the value of variables.

Variables are divided into 4 sets V=(PI, PO, R, T). PI is the set of primary inputs, PO is the set of primary outputs, R is the set of register variables, and T is the set of temporary variables. Operations include the set of control operations, and the set of assignment operations. The result of a control operation is Boolean, and the results are used to control execution of other operations. Assignment operations assign to and change value of variables. Every operation $op_i$, has a corresponding condition $c_i$, associated with it. The condition $c_i$, is a logical expression and may be composed using the results of other assignment and control operations. The operation $op_i$ is executed only if $c_i$ is true. State transitions may be indicated by goto statements in the code embedded within the states. The execution condition of each such goto statement represents the corresponding state transition condition.

It is assumed that the schedule has a clearly defined begin and end state. An execution of the schedule starts in the begin state and terminates in the end state. Note that the case when there are multiple possible end states can be reduced to the simple case by adding a dummy state to the schedule that has incoming arcs from all the end states of the schedule, and then considering only the dummy stale to be the end state.

4.1.2. Representation of the Behavior.

Different high-level synthesis tools use various representations for the behavioral description, including control flow graph (CFG), data flow graph (DFG), control/data flow graph (CDFG), and Behavioral finite state machine (BFSM). The present invention is not restricted to any particular method of representation of the schedule. Any of these, or other, representations can be used for the verification procedure. For the sake of simplicity and uniformity, the preferred embodiment uses the same data structure to represent the behavior and schedule.

Thus, in the preferred embodiment, a behavior is represented as the Behavior State Transition Graph (or Behavior STG). A behavior STG is similar to the schedule STG described above, except that it is derived in a straightforward manner from the behavior. Any part of the behavior that does not contain a loop may be grouped into a single state. Thus, an acyclic behavior can be translated into a behavior STG with just one state. Having this uniform data structure for the behavior and schedule reduces the equivalence checking problem to proving equivalence of the schedule STG and behavior STG:

Given

A behavior STG (BSTG) and a schedule STG (SSTG).

Correspondence between primary input variables in BSTG and SSTG.

the aim is to prove that the values generated by BSTG and SSTG in corresponding output variables are equal.

As mentioned earlier, in this preferred embodiment, the focus is on the restricted problem of proving equivalence between individual threads of execution in the BSTG and SSTG. A thread of execution in the SSTG (or BSTG) refers to a finite length path in the state transition graph that starts at the begin state and ends in the end state. Note that there is no requirement that the path be simple, i.e., it could pass through a cycle in the state transition graph a fixed, finite number of times.

Given a thread of execution in the SSTG (or BSTG), the computations performed in it are converted into a structure graph.

Definition 1 (Structure Graph) A structure graph is a directed graph G=(V, A), where the set of vertices V represent hardware components that execute the operations, and the edges represent the structural connectivity of the components. A vertex $\in$ V has a type attribute, which may assume the following values: IN (to represent primary input variables and current cycle values of register variables), OUT (to represent primary output variables and next cycle values of register variables), OP (to represent atomic word-level operators, including arithmetic operators and comparison operators), LOGIC (to represent the control or random logic), and MUX. The edges in the structure graph are annotated with their bit-widths.

The process of constructing a structure graph from a set of computations is similar to inferring hardware structures from Hardware Description Languages (HDLs). IN and OUT nodes are created to represent primary input and output variables, constant values, and present and next cycle values of register variables. OP nodes are created corresponding to assignment operations that involve word-level computation and conditional operations (e.g. comparison operations, case operation, etc.). The use of a Boolean operator on single bits or bit-vectors results in the creation of LOGIC nodes in the structure graph. MUX nodes are constructed when different assignment statements assign to the same variable, under different conditions. The outputs of the OP or LOGIC nodes that correspond to these conditions are used as select inputs to the MUX node to decide which assignment is executed in a given clock cycle.

Given a thread of execution T in the SSTG and a corresponding thread of execution T' in the BSTG that need to be proved equivalent, the computations performed along each thread are first converted into a structure graph. Thus, the problem is reduced to proving the equivalence of two structure graphs, $SSG_T$ and $BSG_T$.

In the remainder of this section, a preferred embodiment of the algorithm for equivalence checking of structure graphs is presented that exploits the following properties:

The atomic nature of the OP nodes is preserved when generating the schedule from the behavioral description.

The fact that arithmetic transformations (e.g. distributivity, replacing multiply by shifts and adds, etc.) are not performed.

Definition 2 (Conditional equivalence) A signal v in $SSG_T$ is said to be conditionally equivalent to signals $u_1, u_2, \ldots, u_n$ in $BSG_T$, if there exist corresponding conditions $c_1, c_2, \ldots, c_n$, (a condition represents a non-empty set of value assignments to input variables in $BSG_T$ or $SSG_T$) such that under condition $C_k$, the value at signal v in $SSG_T$ is guaranteed to be the same as the value at signal $u_k$ in $BSG_T$. The notation $(v \cong \{(u_1, c_1), \ldots, (u_n, c_n)\})$ is used to represent conditional equivalence relationships.

BDDs are used to represent the conditions involved in conditional equivalence relationships. In general, the conditions themselves may be expressed in terms of the input variables, and may involve the results of various arithmetic and conditional operations. However, the conditions are expressed in terms of the outputs of OP and MUX nodes, in addition to IN nodes, which are collectively referred to in terms of basis variables. In effect, BDDs are constructed only for the control logic. This includes the next state logic that feeds the PO, $R_{state}$-next, and the logic that determines which paths through the MUX nodes are sensitized or how multi-function FUs are configured.

The pseudo-code for a preferred embodiment of the algorithm to compare $BSG_T$ and $SSG_T$ is shown in FIG. 4. The algorithm starts with equivalence relationships between the IN nodes of $SSG_T$ and $BSG_T$. It generates and propagates conditional equivalence relationships forward through the intermediate signals in $SSG_T$ until the PO nodes are reached, and checks for unconditional equivalence between the output signals in $SSG_T$ and $BSG_T$.

First, ordered sets Arr1 (Arr2) are populated to contain all the nodes in $BSG_T$ ($SSG_T$) such that each node appears only after all the nodes in its transitive fanin, using a backward depth first search traversal. Next the basis variables in $BSG_T$ are identified as the outputs of PI, OP, and MUX nodes. A traversal through Arr1 is then performed, and for each node whose output does not correspond to a basis variable (i.e., each LOGIC node), the BDD for the output of the node are obtained in terms of the BDDs at its inputs. Each $SSG_T$ node is associated with an equivalence list to represent the conditional equivalence relationships between its output and signals in $BSG_T$. An entry in the equivalence list is a pair (u,c) where u is an identifier for a $BSG_T$ signal, and c is a BDD representing the conditions for equivalence. The correspondence between the inputs of $BSG_T$ and $SSG_T$ are used to create the equivalence lists for the IN nodes in $SSG_T$. Next, Arr2 is traversed, and each node is processed to propagate the equivalence lists from its inputs to its output. The techniques for propagating equivalence lists through OP, LOGIC, and MUX nodes are explained below. When a PO node of $SSG_T$ is reached, the algorithm checks to see if an equivalence has been established with the corresponding OUT node in $BSG_T$, and if the corresponding condition is a tautology. If not, the algorithm reports the $SSG_T$ and $BSG_T$ as not being equivalent. Only if unconditional equivalences are obtained for all the OUT nodes of $SSG_T$ does the algorithm declare $SSG_T$ and $BSG_T$ to be equivalent.

Equivalence relationships are propagated through OP nodes as follows. An OP node v in $SSG_T$ and an OP node u in $BSG_{T_1}$ that performs the same operation are present such that the inputs of v have conditional equivalence relationships to the corresponding inputs of u. In such a case, the outputs of v and u are equivalent to the conjunction of the equivalent conditions of corresponding inputs. Upon encountering a LOGIC node, rather than propagating equivalence lists to its output, a BDD is constructed to represent its output as a function of basis variables in $BSG_T$. This is done because the LOGIC nodes may be transformed or introduced in the schedule, hence they need to be interpreted in order to prove the equivalence of $SSG_T$ and $BSG_T$.

Propagating an equivalence list from the 1 (0) data input of a 2-input MUX node to its output is done by obtaining a BDD for the select signal, and conjuncting it (its complement) with all the conditions in the equivalence list of the data input.

4.2. Algorithm for Verifying the Schedule for the General Case

This sub-section describes a preferred embodiment of an algorithm for the general case. The task of the algorithm is to establish unconditional equivalence between the outputs of the schedule and behavior. If the STGs were acyclic, the symbolic simulation based equivalence checker of Section 4.1 would suffice. In the presence of feedback (loops), for the equivalence checking algorithm to be useful, it needs to verify the equivalence of the two descriptions without iterating the loops to completion. To handle loops, the algorithm extracts loop invariants, the invariants being the variable correspondences between the schedule and behavior at loop exit points. The invariant extraction is based on automated induction techniques that make it unnecessary to iterate loops to completion to produce proofs of equivalence. In the event that all loop invariants are not extracted, the equivalence checker is likely to return a false negative. The equivalence checking algorithm guarantees that if the scheduling is typical, as defined earlier, it will detect all loop invariants and will return true negatives and positives. The algorithm is safe in that it will never return a false positive. Examples are presented herein to illustrate our verification algorithm, and provide details subsequently.

4.2.1. Illustrative Example

The algorithm takes as inputs the state transition graph (STG) representations of the behavior (BSTG) and schedule (SSTG). In addition to the STGs, the lists of primary input and output correspondences are also provided to the algorithms as input. The algorithm operates by enumerating a small set of paths in the SSTG. These paths are used as the basis for proving equivalence between the SSTG and BSTG.

EXAMPLE 3

Figure 2B:
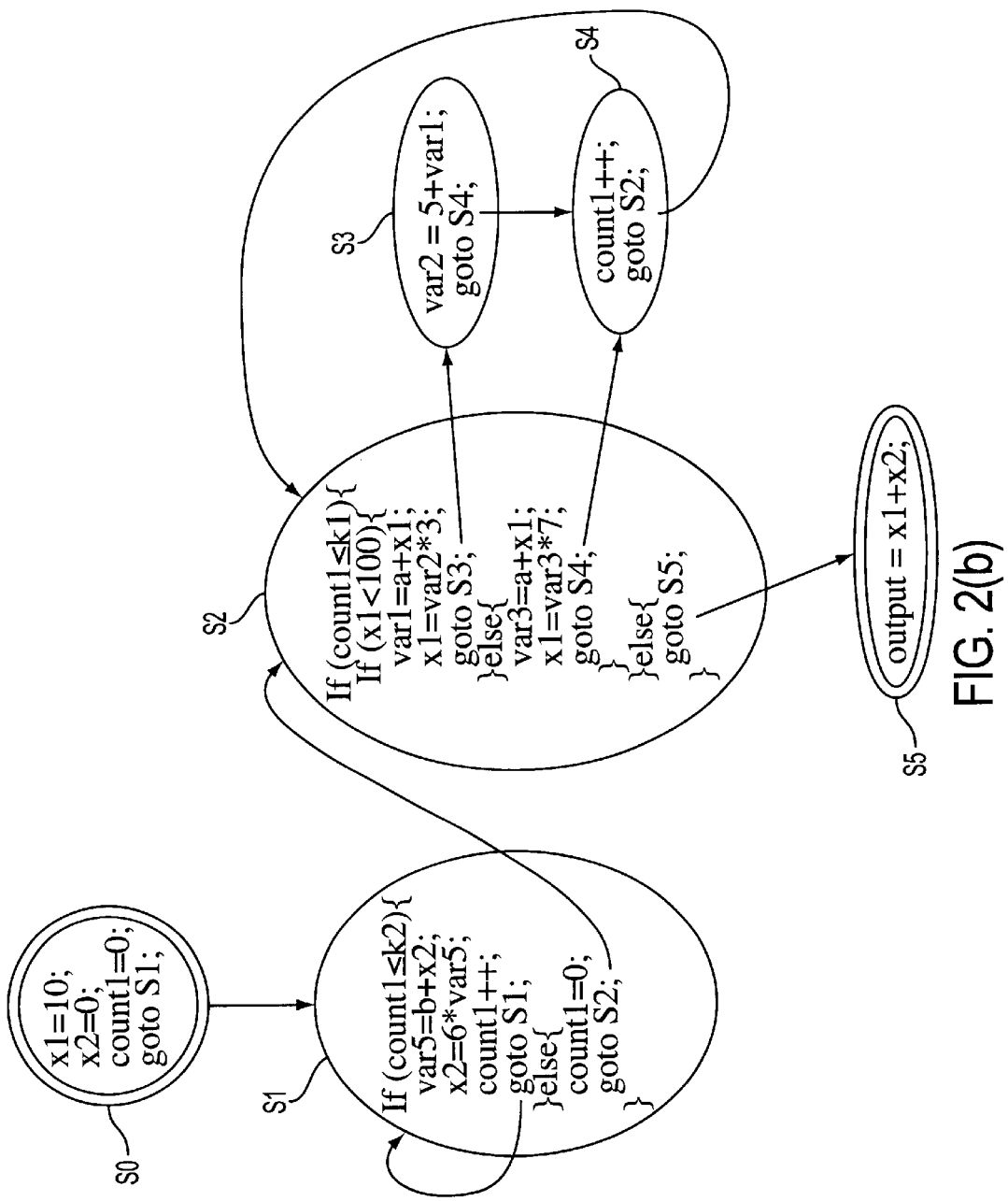
Figure 3E:
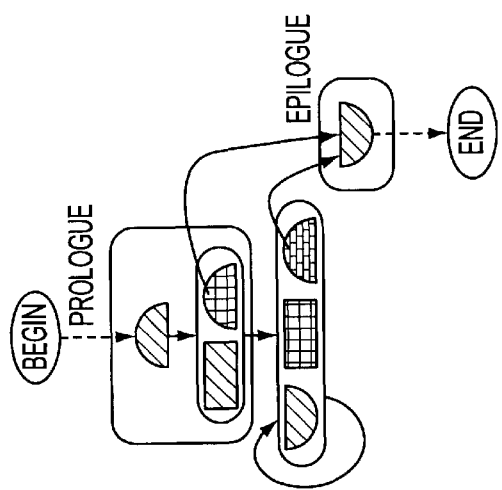
Figure 3D:
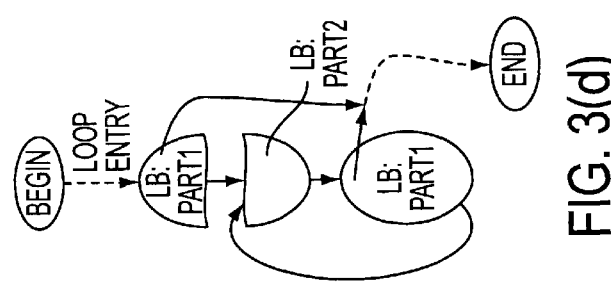
Figure 3C:
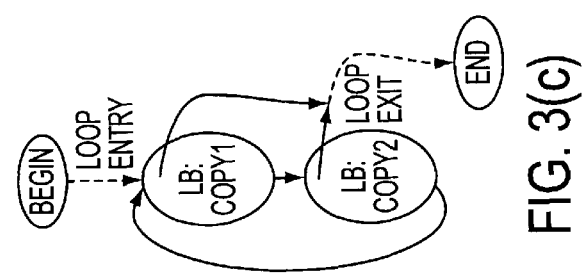
Figure 3B:
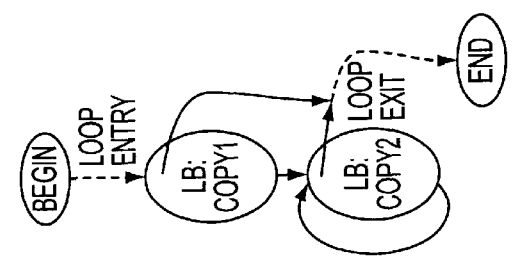
Figure 3A:
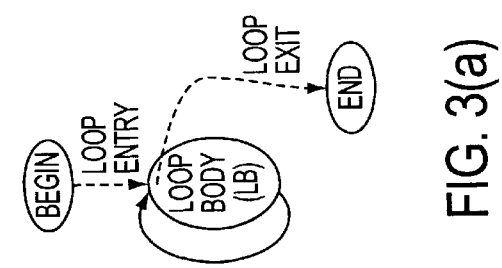
Figures 5A, 5B:
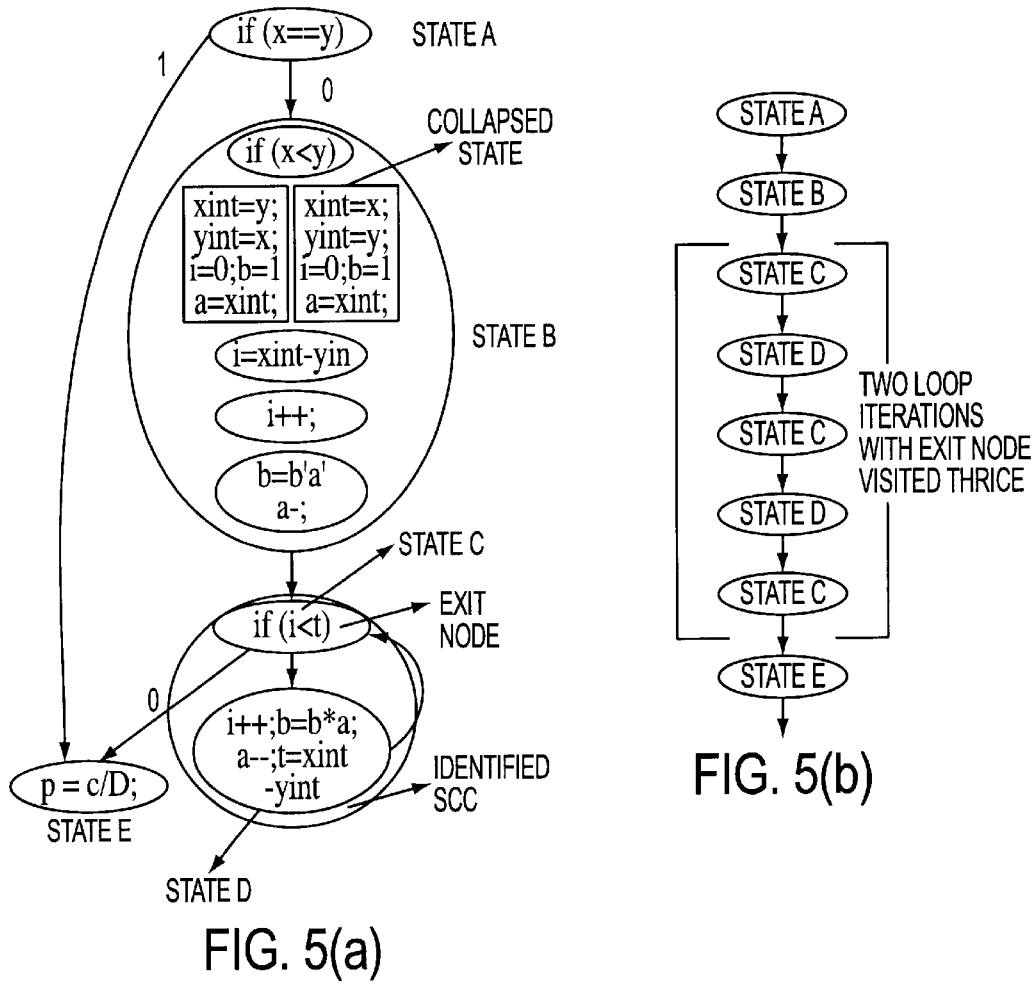

FIG. 5(a) shows an example of a reduced SSTG (where strongly connected components have been extracted and acyclic paths collapsed). For this SSTG, the following state sequences can be enumerated: {AE, ABCE, ABCDCE, ABCDCDCE, . . . }. Note that the path {ABCDCE, ABCDCDCE, . . . } corresponds to different numbers of execution of the loop body. Not all of these paths need to be simulated on the BSTG. Node {C} corresponds to the loop exit point. The number of paths where {C} appears 0, 1, and 3 times is enumerated. These correspond to not encountering the loop at all, encountering the loop exit condition but not the loop body, and executing the loop body twice, respectively. The first two are simple paths, and should be clearly enumerated. The reasons for enumerating the paths with 3 appearances of the exit path is to set up the problem for generation of loop invariants by executing the loop body twice. Therefore, the paths enumerated for this example are {AE, ABCE, ABCDCDCE}.

For each of these paths, the corresponding path in the BSTG is obtained by symbolic simulation. The algorithm next proves that the corresponding SSTG and BSTG paths are equivalent. For the path which includes the loop body, {ABCDCDCE}, the algorithm proceeds further and inductively proves that if the operations in the loop body were executed any number of times, the equivalence relationship between the corresponding SSTG and BSTG path would still be maintained. To do so, the algorithm extracts the variable correspondences at the cut points {ABCDC} and {ABCDCDC}. In this case, the set of correspondences at the cut points {ABCDC} and {ABCDCDC} remain the same. Therefore, it can be argued by induction that concatenating any number of sequences {DC} to {ABCDCDC} would still maintain the variable correspondences. So if {ABCDCDCE}, and the corresponding BSTG path are equivalent, then for any number of iterations of the loop body, the SSTG and BSTG would still be equivalent.

Next, a different scenario is considered, where the set of corresponding variables at the cut points corresponding to loop exits do not remain the same. When, the set changes, it is necessary to iterate to convergence to avoid false results.

EXAMPLE 4

Figures 6A, 6B:
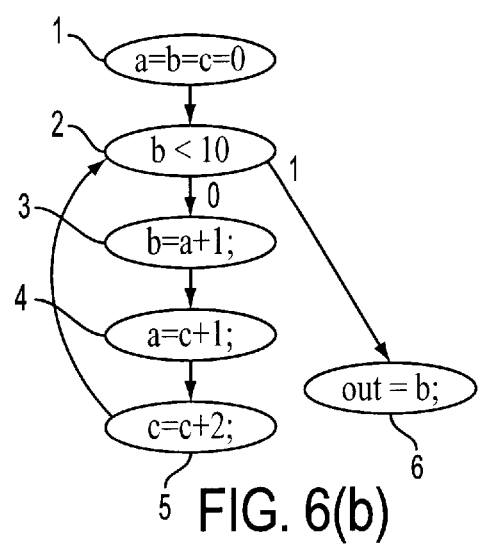

The example shown in FIG. 6 illustrates why it is necessary to iterate to convergence to avoid a false positive. FIGS. 6(a) and (b) depict the behavior and schedule, respectively, for a circuit. Note that the two do not correspond because of the statement c=d+2 in State 5 of the schedule. The path containing the loop body that is initially identified is {1, 2, 3, 4, 5, 2, 3, 4, 5, 2, 6}. State 2 in FIG. 6(b) is identified as the loop exit, and States 3, 4 and 5 are identified as the loop body. After symbolic simulation of one iteration of the loop, the variable correspondences obtained are {a≡p, b≡q, d≡s}, and after two iterations they are {b≡q}. Note that, using any of these as the correspondence set for simulating the statement after the loop in State 6 (out=b) would lead to a false positive due to b and q being regarded as equivalent.

It is only after the third iteration that the procedure determines that b and q do not correspond, and the schedule and behavior can be deemed nonequivalent. Hence, in this case, to attain convergence, one more iteration of the initial path has to be simulated, i.e. the path {1,2,3,4,5,2,3,4,5,2, 3,4,5,2,6} also needs to be simulated.

EXAMPLE 5

One final scenario needs to be considered. In the previous example, the set of correspondences after loop iterations monotonically decreased till it reaches convergence. However, in general, an example where this set may change arbitrarily as more iterations are performed is considered. It should be noted that, an effective goal is to check equivalence for all number of iterations of the loop body. Therefore, all minimal correspondence sets until convergence is obtained should be tracked. These correspond to sets which are not super-sets for any other correspondence sets. The code following the loop body is simulated for all such minimal sets, in addition to simulating it for the correspondence set obtained after convergence. It should be noted that, not simulating with the additional correspondences might result in false positives. As shown subsequently, symbolic simulation using these minimal correspondence sets is necessary and sufficient for checking equivalence.

4.2.2. Algorithm Details

Pseudo-code for a preferred embodiment of the method of the present invention that handles the general case is shown in FIG. 7. The first task of the algorithm is to identify the portions of the SSTG that constitute the loops, since loop invariants need to be computed at the loop exit points. The loops are found by identifying the strongly connected components (SCCs). Each SCC has one or more exit nodes, from which it is possible to transition out of the SCC. The SSTG is then collapsed in order to merge subpaths which do not pass through an SCC to reduce the total number of nodes and paths which need to be enumerated subsequently. FIG. 5(a)

shows how an SSTG is affected by these steps. As a consequence of these steps, State C is identified as an exit point of the SCC consisting of States C and D.

Line 4 marks the beginning of the loop which enumerates paths in the reduced SSTG. These paths must be checked against corresponding paths in the BSTG. Reduction of the SSTG prior to the path enumeration results in significantly fewer paths. For the SSTG of FIG. 5(a), the three paths initially enumerated would consist of the following state sequences: {AE, ABCE, ABCDCDCE}. For each of these paths, the corresponding path in the BSTG is obtained by symbolic simulation. Line 5 obtains the RTL circuit (called SSG) for an enumerated SSTG path. It also identifies the cuts in the RTL circuit corresponding to each transition to an exit node in the SSTG path. A cut, in the context of the present disclosure, is defined as the set of variables propagated from one state to another by means of a state transition. Line 6 generates a signal called Pathsignal encapsulating all the state transition decisions required to enumerate the SSTG path. Symbolic simulation to identify the path in the BSTG corresponding to the SSTG path is carried out in Line 7 by means of the procedure Constrained_symbolic_simulation( ) using the Pathsignal of the SSTG path.

Details of Constrained_symbolic_simulation( ) are described in FIG. 8. Beginning with the root state in BSTG, its task is to identify states which are reachable by means of transitions compatible with Pathsignal. In each reached state, it carries out an uninterpreted symbolic simulation to identify corresponding signals (Line 5). It then identifies the outgoing transitions from that state which are compatible with Pathsignal. This process is continued until it reaches the END states in BSTG.

Back in the overall algorithm of FIG. 7, the next step is to extract invariants from loops in the enumerated path (Lines 8–12). This step would not be necessary in the absence of loops. For each SCC encountered along the path, the procedure return_loop_invariants( ) described in FIG. 9 is called. The procedure returns the list of variable correspondence sets as corresp_set_list. For each correspondence set in this list that is smaller than the variable correspondences obtained at the SCC cut as a result of prior symbolic simulation, symbolic simulation of the portion of the path following the SCC must be redone as indicated in Line 12. Lines 13 and 14 test if the output equivalence obtained is conditional on anything other than path conditions. If it is so conditional, the STGs are deemed unequal. If the outputs are unconditionally equivalent for all enumerated paths, the STGs are deemed equivalent.

With reference to FIG. 9, the inputs to return_loop_invariants( ) are the three cuts (ssg_cuts 1, 2, and 3) in the SSG corresponding to the three instances when the exit node of the SCC is encountered in the enumerated path. The procedure returns a list of correspondence sets for which symbolic simulation of the portion of the path following the loop must be carried out. Line 1 in the procedure obtains the variables in the BSG (denoted bsg_cuts) corresponding to ssg_cuts. Lines 2 and 3 obtain the two circuits between the derived cuts in the BSG and ensure that the circuit between cuts 2 and 3 is just another instance (a copy) of the circuit between cuts 1 and 2. If that is not the case, it is deemed that there are no correspondences and the appropriate corresp_set_list is returned. If the circuits between the cuts are isomorphic, a non-trivial correspondence set may exist.

To find this set, the procedure symbolically simulates the SSG and BSG forward one loop iteration (i.e., the portion between two cuts) at a time, starting at the initial cut 2. The variable correspondences obtained at the end of each simulation (corresp_set$_{n+1}$) are compared with the correspondences at the start of the simulation (corresp_set$_n$). If the sets are identical, this is the required fixed point and the procedure returns the correspondence list found at this point as part of corresp_set_list. Otherwise, the symbolic simulation for one loop iteration is repeated with corresp_set$_{n+1}$ as the initial variable correspondences. The procedure also adds a correspondence set to corresp_set_list whenever the use of this correspondence set in the symbolic simulation of one iteration generates a new variable correspondence. This is to avoid false positives as discussed in Example 4 and 5.

The number of iterations required to identify all the variable correspondences is bounded by the total number of variable correspondences possible. In the worst case, this could be the product of the number of variables in the loop bodies in the SSG and the BSG. In practice, the number of variable correspondences is linear in the number of variables, with most of the correspondences being found after the first iteration itself. Therefore, this procedure is a means to obtaining the loop invariants with a finite (in practice, very few) loop iterations.

4.2.3. Correctness and Scope of the Algorithm

A false positive arises when the verification tool deems the two representations equivalent, when in fact they are not. A false negative arises when the verification tool deems the two representations to be inequivalent when in fact they are equivalent. The following theorem characterizes the algorithm of the present invention:

Theorem 2 The procedure Compare_STGs of FIG. 7 is guaranteed not to generate false positives or false negatives under the assumptions of (a) "typical" scheduling, and (b) no possibility of negatives due to infeasible iteration counts.

Proof. When the schedule and behavior are both acyclic, it is a property of the basic symbolic simulation based equivalence checker that false positives will not be generated. False negatives can be generated in the acyclic case only when knowledge of the functionality of the operations which are uninterpreted by the symbolic simulator is used in optimization. For the rest of the analysis, the fact that the symbolic simulation based equivalence checker finds correct variable correspondences in acyclic paths can be relied on.

More interesting is the analysis of when false negatives and positives can arise in our algorithm in the presence of loops. The cases when the behavioral description is cyclic but the scheduled description is acyclic, or vice-versa, are not allowed by typical scheduling. In the context of loops in both descriptions, false positives occur when too many variable correspondences are generated, while false negatives occur when too few variable correspondences are generated.

Consider false negatives first. The correctness of loop termination is checked in our procedure by establishing correspondence between the termination conditions of the loops in the schedule and behavior. The present approach is not aware of any infeasible iteration counts. If the optimizations used to generate the scheduled description use knowledge of infeasible iteration counts, the present procedure might report a false negative. This can also happen when the difference between the loop bodies is "activated" only after a number of iterations that is infeasible. Therefore, under assumptions of typical scheduling and no infeasible iteration counts, such false negatives cannot arise.

As indicated in FIG. 9, the invariant extraction procedure iterates the loop to convergence until it identifies a set of variable correspondences which does not change from one iteration to the next. Each minimal variable correspondence set (which is not a subset of any other correspondence set)

generated in the process is separately used to perform a simulation of the code after the loop exit point. Let $CS_n$ represent the variable correspondence set obtained after n iterations of the loop. Let $\{CS^i\}$ denote the set of minimal variable correspondence sets, which are used for further simulation. In other words, $CS_n \subseteq \{CS^i\}$ is a minimal correspondence set, and is used for symbolic simulation from the loop exit onwards.

Clearly, any negative equivalence result arising due to simulation with any $CS_n \subseteq \{CS^i\}$ is a true negative due to the assumption of no infeasible iteration counts and the basic property of the symbolic simulation procedure.

Now consider false positives. Suppose k+1 iterations were required to arrive at the fixed point for the set of variable correspondences, i.e. $CS_k = CS_{k+1}$. Due to induction, it can be argued that this is the correct set of variable correspondences for any executed path corresponding to n iterations, where n≧k. Therefore, a positive equivalence result obtained after simulation with $CS_k$ is a true positive for all n, n≧k.

Now, consider the paths in the schedule corresponding to fewer than k iterations of the loop, i.e. consider any n<k. It needs to be shown that the algorithm performs correctly for checking termination after n iterations, i.e. there are no false positives in this case. There are the following two cases to consider:

1. $CS_n$ is one of the minimal correspondence sets, i.e. $CS_n \subseteq CS^i$: In this case, since all minimal correspondence sets are explicitly simulated from the loop exit point onwards, $CS_n$ cannot generate a false positive.
2. $CS_n$ is not one of the minimal correspondence sets: By definition of minimal correspondence sets, $CS_n$ has to be a superset of one of the correspondence sets in $\{CS^i\}$. In this case, if the symbolic simulations with all the correspondence sets in $\{CS^i\}$ generate positives results, the symbolic simulation with $CS_n$ would do so as well, and a separate simulation with $CS_n$ is not required. (On the other hand, if the symbolic simulation with any of the correspondence sets in $\{CS_i\}$ generates a negative, the descriptions are inequivalent, and the symbolic simulation with $CS_n$ is inconsequential.)

4.2.3.1. Handling Nested Loops

In order to handle nested loops, the inner loop must be analyzed for invariants each time it is visited. Some analysis to determine loop nesting is required in addition to the Compare_STGs procedure presented earlier. The reader is referred to the case study in Section 5.2 of an example with nested loops for an intuitive explanation of how nested loops are handled.

4.3. Efficiency of the Algorithm

The efficiency of the algorithm fundamentally derives from three factors:

(1) the datapath state is not enumerated;
(2) arithmetic is not interpreted,
(3) loops are not iterated to completion to extract invariants.

Factors (1) and (2) are incorporated into the uninterpreted symbolic simulator used in the inner loops of the algorithm for equivalence checking. Factor (3) is due to our invariant extraction algorithm. SCC identification and identification of exit points in the SSTG in the procedure Compare_STGs( ) is linear in the size of the SSTG. The path enumeration in Compare_STGs( ) is done on the collapsed SSTG, implying that the number of paths enumerated in the worst case will be exponential in the number of loops in schedule rather than the number of states in the SSTG. This number of paths is likely to be typically very small. In order to extract the invariants, the number of loop iterations required to be enumerated is bounded by the number of variable correspondence relationships possible. In the worst case this can be quadratic in the number of variables in the loop body. In practice, for typical schedules when no error has been made in the scheduling, all variable correspondences are found by the enumeration of two loop iterations. While Binary Decision Diagrams (BDDs) are required for Boolean operations during symbolic simulation, these sub-circuits are too small in practice for BDD creation to be a bottleneck. The low run time complexity of this algorithm in comparison to techniques like symbolic model checking makes it suitable as a fast customized solution for the specific verification problem we are tackling.

4.4. System for Verification of Scheduling

An important aspect of the present invention is a system for checking correctness of scheduling of a circuit where a schedule for the circuit is obtained from a behavioral description. A preferred embodiment of such a system is shown in FIG. 14. A loop invariants extractor 14.1 determines a sufficient set of acyclic threads when loops are present. A symbolic simulator 14.2 to extract the loop invariants. An equivalence prover 14.3 proves equivalence of the acyclic threads. This system is capable of handling behavioral descriptions that have been transformed through one or more of: introduction of cycle boundaries; operation reordering; loop unrolling winding, folding and pipelining; and through speculative execution of operations.

Yet another key aspect of the present invention is a system for verifying a schedule of a circuit against a behavioral description of the circuit. A preferred embodiment of such a system is shown in FIG. 15. A schedule state transition graph generator 15.2 receives a schedule from 15.1 and specifies the schedule as a schedule state transition graph. A behavior state transition graph generator 15.3 specifies the behavior of the circuit as a behavioral state transition graph. A schedule thread selector 15.4 receives a schedule and selects a schedule thread of execution from the schedule state transition graph. A behavior thread selector 15.5 receives a behavior and selects a corresponding behavior thread from the behavioral state transition graph. A convertor 15.6 converts the schedule thread into a schedule structure graph and the behavior thread into a behavior structure graph. An equivalence checker 15.7 checks equivalence of said schedule structure graph and said behavior structure graph.

4.5. Computer System for Verification of Scheduling

A computer is a very effective means of implementing the techniques of the present invention. Such a computer system that implements the techniques of the present invention is also within the scope of the present invention. Such a computer comprises a processor and a memory. The memory comprises instructions capable of enabling the computer to check the correctness of scheduling a circuit where the schedule for the circuit is obtained from its behavioral instruction. Specifically, the instructions in the memory comprises instructions for extracting loop invariants to determine a sufficient set of acyclic threads when loops are present. Further, the instructions comprise instructions for symbolic simulation to extract the loop invariants. Still further, instructions comprise instructions to prove equivalence of the acyclic threads.

It should be noted that the computer could be any kind of computer including a PC, mainframe, a workstation or a remote computer on a network.

A preferred embodiment of the computer system consist of a computer with a memory comprising instructions. These instructions are capable of enabling the computer to implement the pseudo-code shown in FIG. 4. Further preferred embodiments consist of computers with memories comprising instruction that are capable of enabling the computer to implement the pseudo-codes shown in FIGS. 7–9, individually and in all possible combinations.

It should be noted that the instructions could be in any form including, but not limited to: higher level languages, lower level languages, assembly languages and machine languages.

4.6. Computer Program Product for Verification of Scheduling

An important aspect of the present invention is computer program product. This program product includes a compute readable medium with instructions said instruction enabling a computer to solve a test generation problem. It should be noted that the computer readable medium includes any fixed media including, but not limited to, floppy disk, hard disk, CD, chips, tapes, cartridges with ICs, etc. The computer readable media also includes instructions transmitted through a network or downloaded from the internet.

In a preferred embodiment the computer code is capable of enabling a computer to check correctness of scheduling of a circuit where a schedule for the circuit is obtained from a behavioral description. The computer code comprises computer code for extracting loop invariants to determine a sufficient set of acyclic threads when loops are present, computer code for symbolic simulation to extract the loop invariants, and computer code to prove equivalence of the acyclic threads.

A preferred embodiment of the computer program product comprises a computer-readable media comprising computer code. This computer code is capable of enabling the computer to implement the pseudo-code shown in FIG. 4. Further preferred embodiments consist of computer program products with computer readable media comprising code capable of enabling the computer to implement the pseudo-codes shown in FIGS. 7–9, individually and in all possible combinations.

It should be noted that the computer code could be could be in any language including, but not limited to: higher level languages, lower level languages, assembly languages and machine languages.

4.7. Results: Case Studies

The results of applying this invention are presented in the form of detailed case studies of the application of our algorithm our actual examples of scheduling. These designs are large enough in terms of the number of state variables and the complexity of the arithmetic operations that conventional BDD-based verification approaches based on state machine equivalence or symbolic model checking are guaranteed to fail.

4.7.1. Example With Speculative Scheduling

Figure 10B:
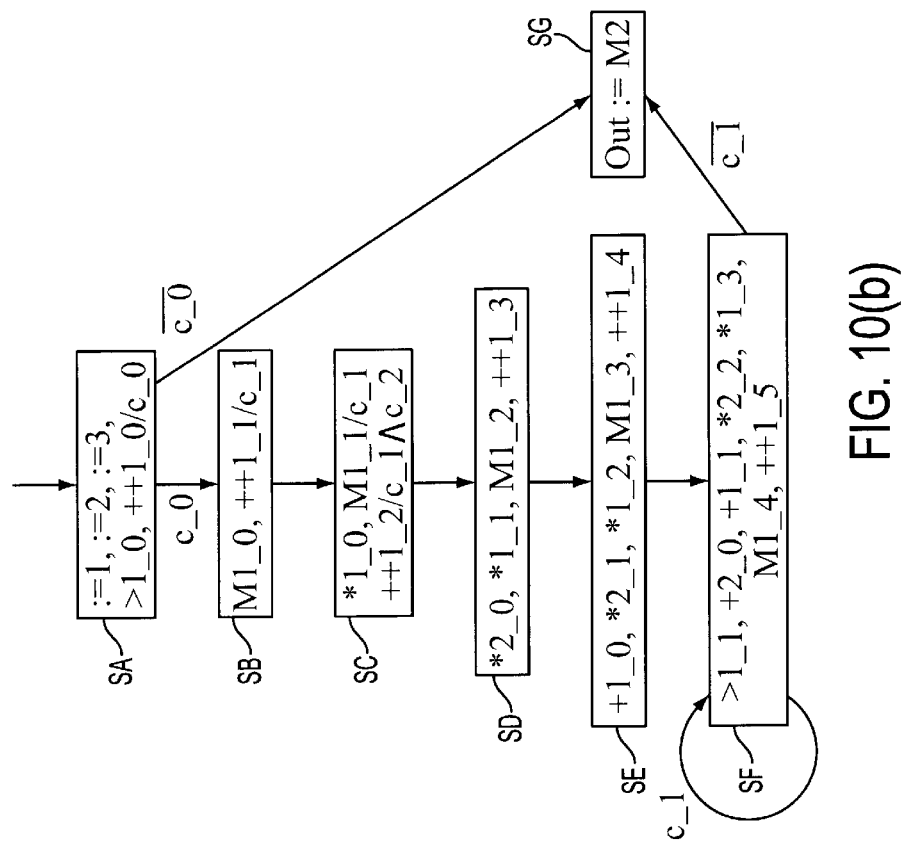
Figure 10A:
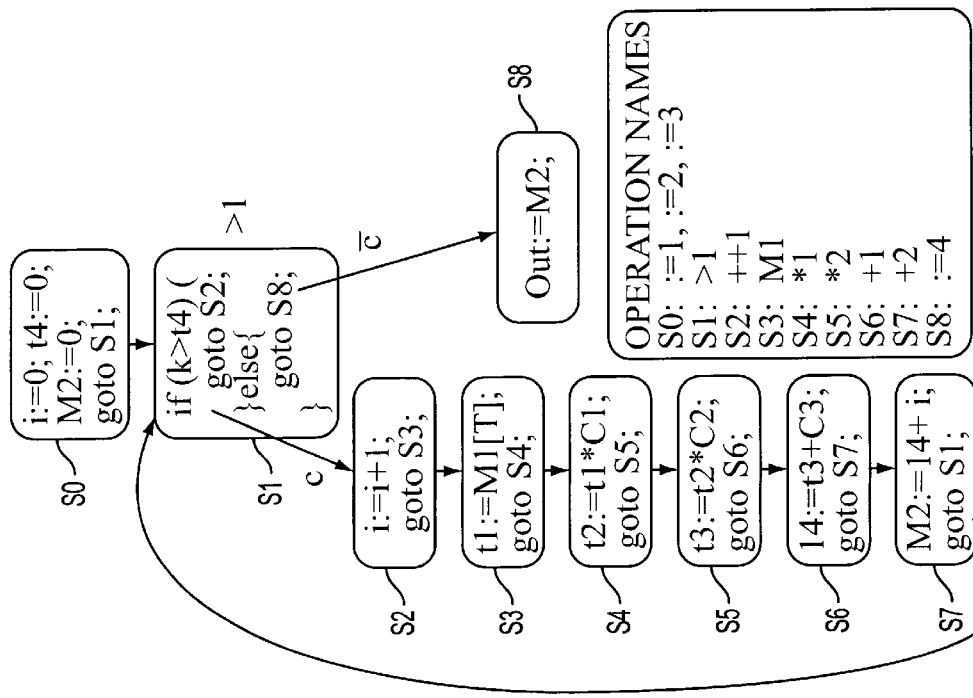

Consider the behavior STG shown in FIG. 10(a). This behavior was scheduled by a state-of-the-art scheduler that incorporates speculative execution and loop transformations, and the resulting schedule STG is shown in FIG. 10(b). Consider the loop in the behavior. Note that under the steady state, (i.e., assuming that the loop is executed a large number of times), the schedule STG traverses the SCC consisting of state S6. By performing an analysis of the schedule, it is possible to show that in the steady state, a new iteration of the loop is initiated every clock cycle, leading to a large performance improvement.

From the verification standpoint, what makes this example interesting is that it simultaneously incorporates most of the optimizations mentioned in Section 1.2—introduction of cycle boundaries, re-ordering of operations, replication of path segments, loop pipelining, and speculative execution. These optimizations add significantly to the complexity of the schedule. A VHDL description of the behavior STG consists of 122 lines of code, and contains 7 operations and 8 intermediate variables (excluding primary inputs and primary outputs), while a VHDL description of the schedule STG consists of 289 lines of code and contains 47 operations and 54 intermediate variables. Clearly, a structural isomorphism check of the behavior and schedule would not be able to prove their equivalence. The use of a conventional lower-level (e.g. gate-level) FSM equivalence checking tool such as VIS that performs a traversal of the (data path+controller) state space is prohibitive—the behavior STG contains 250 state bits, while the schedule STG contains a significantly larger number of state bits. See R. K. Brayton et al., "VIS: A system for verification and synthesis," in *Proc. int. Conf Computer-Aided Verification*, July 1996.

The various steps performed in the verification procedure of the present invention is illustrated in order to prove the equivalence of the two STGs shown in FIGS. 10(a) and 10(a). The threads initially enumerated in the SSTG by line 4 of procedure COMPARE_STGs shown in FIG. 7 would be (SA, SG), (SA, SB, SC, SD, SE, SF, SG), (SA, SB, SC, SD, SE, SF, SF, SG), and (SA, SB, SC, SD, SE, SF, SF, SF, SG). For each of these threads, the procedure generates structure graphs for the behavior and schedule, and proves the equivalence of the output using the symbolic simulation procedure presented in Section 3. In addition, for thread (SA, SB, SC, SD, SE, SF, SF, SF, SG), the procedure to extract loop invariants is invoked.

Figure 11A:
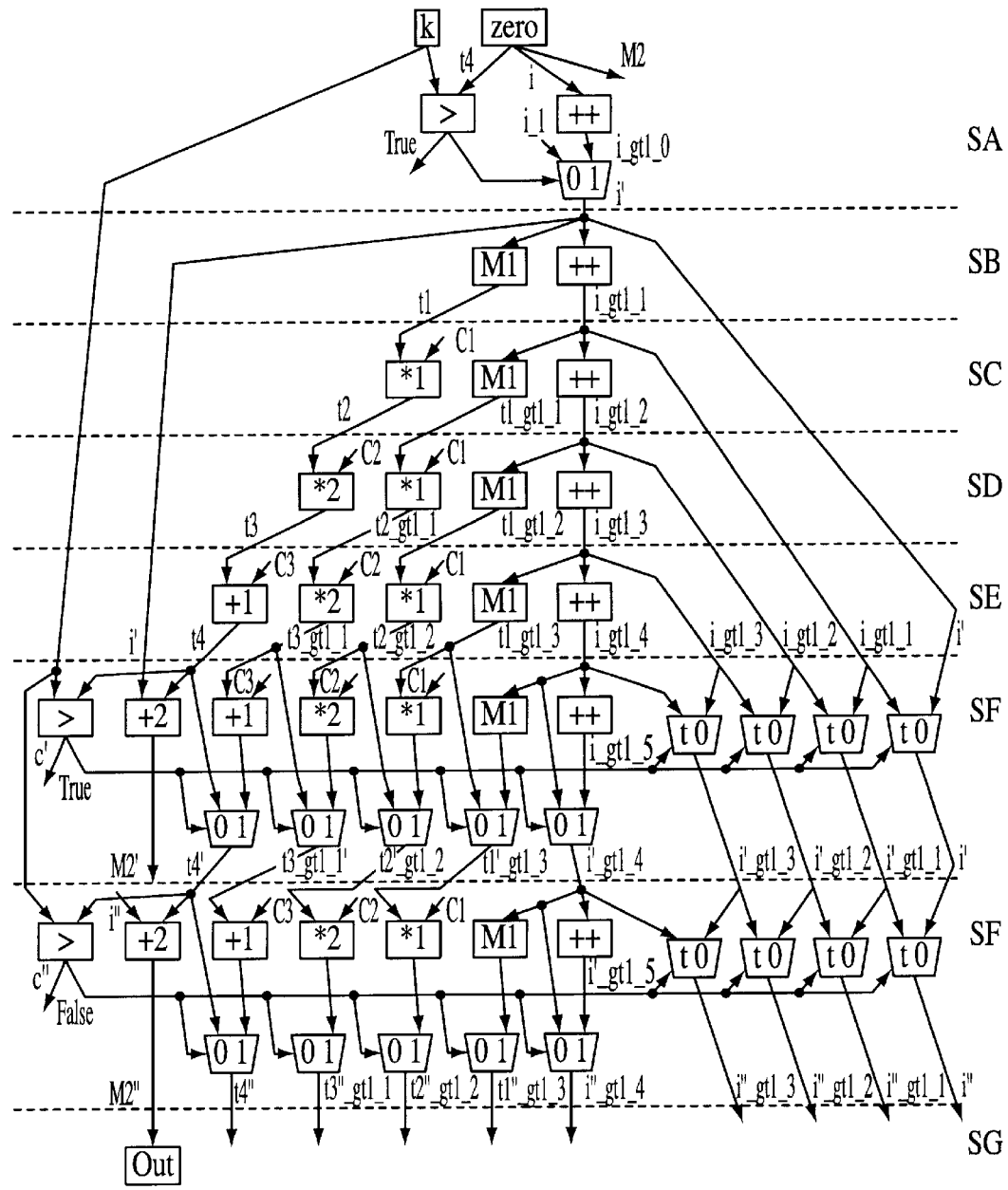

In order to examine how the symbolic simulation proceeds and detects loop invariants, consider, for now, the thread T1=(SA, SB, SC, SD, SE, SF, SF, SG). The schedule structure graph, $SSG_{T1}$ is shown in FIG. 11(a). The cuts in the structure graph corresponding to state boundaries in the schedule are indicated using dotted lines.

Figure 11B:
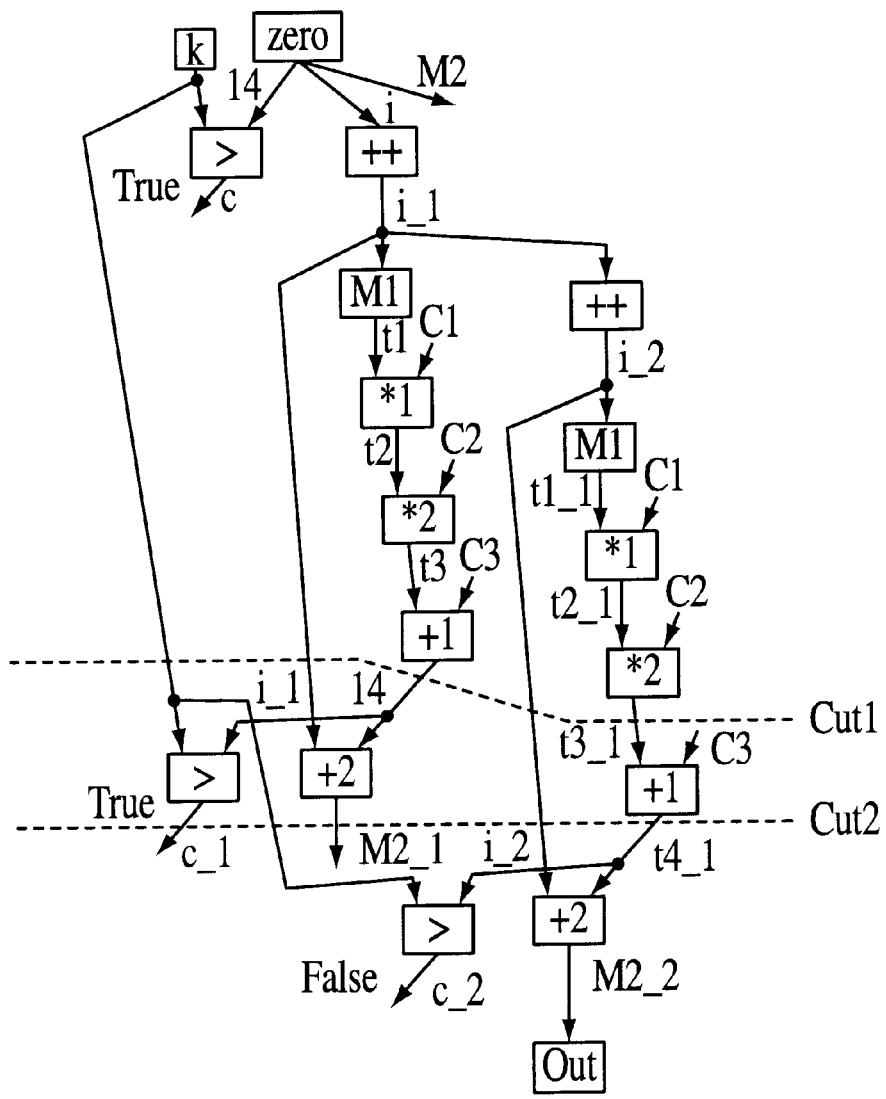

The procedure CONSTRAINED_SYMBOLIC_SIMULATION automatically extracts the corresponding threads in the behavior, and the corresponding structure graph. The resulting behavior thread is T2=(SO, S1, . . . , S7, S1, . . . , S7, S1, S8), and its structure graph ($BSG_{T2}$) is shown in FIG. 11(b). Note that since state boundaries in the schedule and behavior STGs do not correspond, the "cuts" in $BSG_{T2}$ corresponding to cuts in $SSG_{T1}$ are determined using the equivalence relationships. For example, the equivalence relationships involving signals at the first cut in $SSG_{T1}$ are:

$(t4, t4, 1), (M2, M2, 1), (c, c, 1), (i\_gt1\_0, i\_1, 1), (i', i\_1, c)$ where an entry (s1, s2, cond) implies that signal s1 in $SSG_{T1}$ and signal s2 in $BSG_{T2}$ are equivalent under condition cond. It can be seen that signals c and $i_1$ form the corresponding cut in $BSG_{T2}$. The cuts formed in $BSG_{T2}$ corresponding to the fifth and sixth cuts of $SSG_{T1}$ are indicated in FIG. 11(b) using dotted lines. These cuts represent the beginning and end of the first iteration of the schedule STG loop involving state SF. The equivalence relationships involving signals that are members of these two cuts are:

$(i', i\_1, c), (i\_gt1\_1, i\_2, c), (t4, t4, c), (t3\_gt1\_1, t3\_1, c)$ and $(c', c_1, c), (M2', M2\_1, c), (t4', t4_1, c.c\_1), (i'', i\_2, c.c\_1)$ The above clearly indicates that correspondences for many of the loop boundary variables are not present (e.g.

t3'_gt 1_1, t2'_gt1_2, etc). Upon further analysis, it can be seen that a large part (the part shaded in the figure) of $SSG_{T1}$ has not been simulated. Unrolling the loop in the schedule for one more iteration will result in new equivalence relationships being found for variables in the shaded part (i.e., the set of loop invariants increases). For this example, it can be shown that it is necessary to unroll the loop a total of 6 times for the equivalence relationships between the loop variables to converge. It is interesting to note that (not co-incidentally), the loop in the behavior was pipelined to a factor of 6 by the scheduler in deriving the schedule.

4.7.2. X.25 Communications Protocol

This example is the send process of the X.25 communications protocol. See S. Bhattacharya, S. Dey, and F. Brglez, "Performance analysis and optimization of schedules for conditional and loop-intensive specifications," in *Proc. Design Automation Conf*, pp. 491–496, June 1994. The control flow graph for the behavior with the straightforward allocation of states to operations is shown in FIG. 12(*a*). Note that it uses array variables. Array access is considered to be an uninterpreted function. It is ensured that the array indices and the array names correspond. A correct schedule obtained from it is shown in FIG. 12(*b*). The numbers inside each state correspond to the operations carried out inside that state. The example is interesting for two reasons. The first is the nested loop corresponding to States S11 and S12. The second is that the data flow graphs generated on the paths in the schedule are not structurally isomorphic to the corresponding paths generated in the behavior. FIG. 12(*c*) shows an incorrect schedule for the same behavior. In order to find the nesting of loops, we derive the regular expression for the STG of the schedule. See Z. Kohavi, *Switching and Finite Automata Theory*. McGraw-Hill Book Company, second ed., 1978.

Consider FIG. 12(*b*) first. The regular expression derive for it is $S_0 S_1 S_2 S_4 (S_3 S_4)*_{(S5} S_2 S_4 (S_3 S_4)*)* S_6$. Each subexpression superscripted with a * constitutes a loop body. This clearly identifies the nesting of loops. Each time the path enumeration comes across a loop body, it must again identify the invariants for that loop. For example, in the subexpression $(S_5 S_2 S_4 (S_3 S_4)*)*$, invariants for the inner loop $(S_3 S_4)*$ must be extracted as many times as the number of iterations required of the outer loop to derive the loop invariants of the outer loop. The rest of the procedure is the same as before, and follows along the lines of the first case study.

Now consider FIG. 12(*c*). The regular expression derived is $S_0 S_1 S_2 S+_4 ((S_3 S_2 S_4)* + (S_5 S_2 S_4)*)* S_6$. Note that this regular expression is different from the previous one in that it consists of two loops with a shared subexpression inside an outer loop. It is of interest to determine the loop invariants of the outer loop in the subexpression $((S_3 S_2 S_4)* + (S_5 S_2 S_4)*)*$. To achieve that, a finite number of iterations of the outer loop must be evaluated before the variable correspondences stabilize. For each additional iteration of the outer loop, all possible combinations of the inner loop instantiations are considered. For example, if the outer loop were the subexpression $(A*+B*)*$, two iterations of the outer loop imply that we must compute variable correspondences along the following four paths: A*A*, A*B*, B*A*, B*B* Note that each path consists of individual loops with no nesting. With a third iteration of the outer loop, the paths enumerated become: A*A*A*, A*B*A*, B*A*A*, B*B*A*, A*A*B*, A*B*B*, B*A*B*, B*B*B*. In order to prove loop invariance for the outer loop, we must show that the variable correspondences generated from a subpath $P_n$ in the $n^{th}$ iteration of the outer loop remain the same as the correspondences generated from all the subpaths in the $n+1^{th}$ iteration derived from $P_n$. For instance, in the hypothetical example above, the loop correspondences generated after A*A* after two iterations of the outer loop must remain the same as the correspondences after A*A*A* and A*A*B* in the third iteration. The schedule in FIG. 12(*c*) is actually incorrect as a result of the incorrect implementation of the transition out of State S3. This is detected in our procedure since it is unable to establish correspondence between the data [ ] variables in the two representations.

4.7.3. Binary Tree Sort

This example is a hardware implementation of a binary-tree sort algorithm. The two-part algorithm first generates a sorted binary tree and then prints it out in the correct order. The behavioral code fragment for part of the algorithm is shown in FIG. 13(*a*). The behavior clearly indicates that the statement outp=val [p] in State S1 must be executed before the statement outdat=outp in State 52. The schedule for the corresponding code fragment with the resource constraint of one adder is shown in FIG. 13(*b*). The scheduling for this example was done manually by a designer who recognized that one cycle could be saved by merging the States S1 and S2 as long as the causal relationship between their statements was preserved. Note that this optimization makes a lot of sense since the States S1 and S2 appear in two loop bodies. A cycle saved in the loop can result in a large number of total cycles saved. Unfortunately, the designer neglected to change the type of the variable outp from register to wire. As a result, the causal relationship was not reflected in the schedule. The procedure of the present invention detects this simple error by not detecting a correspondence between the variables outdat in the behavioral and schedule STGs. While the error itself is simple, note that the loop structure of the code fragment is quite complex with nested and intersecting loops. Our algorithm is capable of detecting the error in spite of the complex loop structure.

4.8. Conclusions

In this disclosure, a complete formal verification technique to verify the correctness of a schedule of a high-level behavioral specification is discussed. Scheduling transformations such as operation re-ordering, speculative execution, and various loop transformations can be verified, thus making it applicable to most existing schedulers. A novel aspect of the algorithm is it's ability to verify designs with loops including data-dependent loops by using automatic inductive techniques along with uninterpreted symbolic simulation. The power and practicality of the verification algorithm is illustrated on several designs.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of verifying a schedule of a circuit against a behavioral description of the circuit, said method comprising:

(a) specifying the schedule as a schedule state transition graph;

(b) representing a behavior of the circuit as a behavioral state transition graph;

(c) selecting a schedule thread of execution from said schedule state transition graph;

(d) identifying a corresponding behavior thread from said behavioral state transition graph;

(e) converting said schedule thread into a schedule structure graph and said behavior thread into a behavior structure graph;

(f) checking equivalence of said schedule structure graph and said behavior structure graph; and (g) repeating steps (c)–(f) for all threads of execution.

2. The method of claim 1 wherein step (f) further comprises:

(i) creating ordered set arr1 containing all nodes in said behavior structure graph such that each node in said behavior state transition graph appears only after all nodes in the transitive fanin of said each node;

(ii) creating ordered set arr2 containing all nodes in said schedule structure graph such that each node in said behavior structure graph appears only after all nodes in the transitive fanin of said each node;

(iii) traversing arr1 and identifying basis variables in the behavior structure graph;

(iv) expressing non-basis variables in the behavior structure graph in terms of basis variables;

(v) constructing equivalence lists for input nodes in the schedule structure graph;

(vi) traversing arr2 and processing each node in arr2 to propagate equivalence lists from an input of the schedule structures graph to output of the schedule structure graph, wherein an entry in each of said equivalence lists is a pair
(u,c) where u is an identifier for a signal in the behavior structure graph and c is a binary decision diagram representing a condition for equivalence;

(vii) checking if an equivalence has been established with a corresponding out node in the behavior structure graph and if a corresponding condition c is a tautology for a primary output node in arr2; and (viii) repeating step (vii) for all output nodes in arr2; and (ix) finding equivalence if all output nodes are found to be equivalent.

3. A method of verifying equivalence between a schedule of a circuit and a behavior of said circuit, wherein said schedule and said behavior could have cyclic threads of execution, said method comprising:

(a) representing the schedule as a schedule state transition graph;

(b) representing the behavior as a behavior state transition graph;

(c) identifying strongly connected components in the schedule state transition graph;

(d) identifying exit nodes in each of said strongly connected components;

(e) collapsing said schedule state transition graph to merge subpaths that do not pass through said strongly connected components;

(f) selecting a hitherto unselected path;

(g) obtaining a structural RTL circuit for the path selected in step (f);

(h) adding circuitry to the structural RTL circuit for generating a pathsignal encapsulating all state transition decisions required to enumerate the selected path;

(i) performing constrained symbolic simulation using the pathsignal to identify a corresponding path in behavior state transition graph, and obtaining a structural RTL circuit for said path;

(j) selecting a hitherto unselected strongly connected component in the selected path;

(k) extracting invariants for the selected strongly connected component in the selected path as a list of correspondence sets;

(l) selecting a correspondence set from the list of correspondence sets;

(m) redoing symbolic simulation if the selected correspondence set is smaller than a variable correspondence obtained at a strongly connected component cut of a prior symbolic simulation;

(n) repeating steps (i)–(m) for all correspondence set in the list of correspondence sets;

(o) testing if an output equivalence condition is conditional on anything other than path conditions;

(p) reporting non-equivalence and exiting this method if said output equivalence is conditional in step (o);

(q) repeating steps (j)–(p) for all strongly connected components in the selected path; and (r) repeating steps (f)–(q) for all paths from a root to sink such that any exit point appears at most thrice.

4. The method of claim 3 wherein the unconstrained symbolic simulation of step (i) is performed using a process comprising:

(i) assigning a begin state of the behavior state transition graph to a permissible paths list;

(ii) selecting a hitherto unvisited state in the permissible paths list;

(iii) generating a behavior structural RTL;

(iv) performing uninterpreted symbolic simulation to identify corresponding signals in the schedule structural RTL and the behavior structural RTL;

(v) adding a new copy of state Sj to permissible paths if a conjunction of transition condition and pathsignal is not zero;

(vi) repeating sub-step (v) for each outgoing transition from Si to Sj; and (vii) repeating steps (iii)–(vi) for all unvisited states until only unvisited states remaining in permissible paths list are instances of an end state.

5. The method of claim 3 wherein invariants are extracted from loops in step (k) using a process comprising for each loop:

(i) identifying three cuts in the structural RTL circuit of the path in the schedule, wherein each cut represents variable values at the boundary of each iteration of the loop;

(ii) identifying the corresponding cuts in the structural RTL circuit of the path in the behavior and checking that the subcircuits between the first and second, and second and third cuts are isomorphic;

(iii) identifying equivalence relationships between variables at each pair of corresponding cuts in the schedule and behavioral RTL circuits;

(iv) checking if the equivalence relationships between the latest and its previous cuts are identical;

(v) if the relationships of step (iv) are not identical, and if the equivalence relationship at the latest cut is a subset of the equivalence relationship at the previous cut, discarding the equivalence relationship at the previous cut, unroll the two RTL circuits for one more loop iteration and repeat from step (iii);

(vi) if the relationships of step (iv) are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeat from step (iii);

(vii) if the relationships in step (iv) are identical, adding the equivalence relationship at the latest cut to the set of equivalence relationship sets;

(viii) removing all entries in the set of equivalence relationship sets that are supersets of other entries;

(ix) designating the final set of equivalence relationship sets as the desired set of invariants.

6. A system for checking correctness of scheduling of a circuit where a schedule for the circuit is obtained from a behavioral description, said system comprising:

a loop invariants extractor to determine a sufficient set of acyclic threads when loops are present;

a symbolic simulator to extract the loop invariants; and an equivalence prover to prove equivalence of the acyclic threads.

7. The system of claim 6 wherein said behavioral description is transformed through introduction of cycle boundaries.

8. The system of claim 6 wherein said behavioral description is transformed through operation reordering.

9. The system of claim 6 wherein said behavioral description is transformed through loop unrolling, winding, folding and pipelining.

10. The system of claim 6 wherein said behavioral description is transformed through speculative execution of operations.

11. A system for verifying a schedule of a circuit against a behavioral description of the circuit, comprising:

a schedule state transition graph generator for specifying the schedule as a schedule state transition graph;

a behavior state transition graph generator for specifying the behavior of the circuit as a behavioral state transition graph;

a schedule thread selector for selecting a schedule thread of execution from said schedule state transition graph;

a behavior thread selector for selecting a corresponding behavior thread from said behavioral state transition graph;

a convertor for converting said schedule thread into a schedule structure graph and said behavior thread into a behavior structure graph; and an equivalence checker for checking equivalence of said schedule structure graph and said behavior structure graph.

12. A computer system with a processor and memory for checking correctness of scheduling of a circuit where a schedule for the circuit is obtained from a behavioral description, said memory comprising instructions said instructions capable of enabling the computer to perform said checking, said instructions comprising:

instructions for extracting loop invariants to determine a sufficient set of acyclic threads when loops are present;

instructions for symbolic simulation to extract the loop invariants; and instructions to prove equivalence of the acyclic threads.

13. The computer system of claim 12 wherein said behavioral description is transformed through introduction of cycle boundaries.

14. The computer system of claim 12 wherein said behavioral description is transformed through operation reordering.

15. The computer system of claim 12 wherein said behavioral description is transformed through loop unrolling, winding, folding and pipelining.

16. The computer system of claim 12 wherein said behavioral description is transformed through speculative execution of operations.

17. A computer system with a processor and memory for verifying a schedule of a circuit against a behavioral description of the circuit, said memory comprising instructions capable of enabling the computer to perform said verifying, said instructions comprising:

instructions for specifying the schedule as a schedule state transition graph;

instructions for representing a behavior of the circuit as a behavioral state transition graph;

instructions for selecting a schedule thread of execution from said schedule state transition graph;

instructions for selecting a corresponding behavior thread from said behavioral state transition graph;

instructions for converting said schedule thread into a schedule structure graph and said behavior thread into a behavior structure graph;

instructions for checking equivalence of said schedule structure graph and said behavior structure graph; and instructions for repeating through all threads of execution.

18. A computer system with a processor and memory for verifying a schedule of a circuit against a behavioral description of the circuit, said memory comprising instructions, said instructions capable of enabling the computer to perform the following steps:

(a) specifying the schedule as a schedule state transition graph;

(b) representing a behavior of the circuit as a behavioral state transition graph;

(c) selecting a schedule thread of execution from said schedule state transition graph;

(d) identifying a corresponding behavior thread from said behavioral state transition graph;

(e) converting said schedule thread into a schedule structure graph and said behavior thread into a behavior structure graph;

(f) checking equivalence of said schedule structure graph and said behavior structure graph; and (g) repeating steps (c)–(f) for all threads of execution.

19. The computer system of claim 18 wherein said instructions further comprises instructions capable of enabling the computer to perform step (f) using the following steps:

(i) creating ordered set arr1 containing all nodes in said behavior structure graph such that each node in said behavior state transition graph appears only after all nodes in the transitive fanin of said each node;

(ii) creating ordered set arr2 containing all nodes in said schedule structure graph such that each node in said behavior structure graph appears only after all nodes in the transitive fanin of said each node;

(iii) traversing arr1 and identifying basis variables in the behavior structure graph;

(iv) expressing non-basis variables in the behavior structure graph in terms of basis variables;

(v) constructing equivalence lists for input nodes in the schedule structure graph;

(vi) traversing arr2 and processing each node in arr2 to propagate equivalence lists from an input of the schedule structures graph to output of the schedule structure graph,
    wherein an entry in each of said equivalence lists is a pair (u,c) where u is an identifier for a signal in the behavior structure graph and c is a binary decision diagram representing a condition for equivalence;

(vii) checking if an equivalence has been established with a corresponding out node in the behavior structure graph and if a corresponding condition c is a tautology for a primary output node in arr2; and (viii) repeating step (vii) for all output nodes in arr2; and (ix) finding equivalence if all output nodes are found to be equivalent.

20. A computer system with a processor and memory for verifying equivalence between a schedule of a circuit and a behavior of said circuit, wherein said schedule and said behavior could have cyclic threads of execution, said memory comprising instructions capable of enabling the computer to perform said verifying using the following steps:

(a) representing the schedule as a schedule state transition graph;

(b) representing the behavior as a behavior state transition graph;

(c) identifying strongly connected components in the schedule state transition graph;

(d) identifying exit nodes in each of said strongly connected components;

(e) collapsing said schedule state transition graph to merge subpaths that do not pass through said strongly connected components;

(f) selecting a hitherto unselected path;

(g) obtaining a structural RTL circuit for the path selected in step (f);

(h) adding circuitry to the structural RTL circuit for generating a pathsignal encapsulating all state transition decisions required to enumerate the selected path;

(i) performing constrained symbolic simulation using the pathsignal to identify a corresponding path in behavior state transition graph, and obtaining a structural RTL circuit for said path;

(j) selecting a hitherto unselected strongly connected component in the selected path;

(k) extracting invariants for the selected strongly connected component in the selected path as a list of correspondence sets;

(l) selecting a correspondence set from the list of correspondence sets;

(m) redoing symbolic simulation if the selected correspondence set is smaller than a variable correspondence obtained at a strongly connected component cut of a prior symbolic simulation;

(n) repeating steps (i)–(m) for all correspondence set in the list of correspondence sets;

(o) testing if an output equivalence condition is conditional on anything other than path conditions (p) reporting non-equivalence and exiting this method if said output equivalence is conditional in step o;

(q) repeating steps (j)–(p) for all strongly connected components in the selected path; and (r) repeating steps (f)–(q) for all paths from a root to sink such that any exit point appears at most thrice.

21. The computer system of claim 20 wherein said instructions further comprises instructions capable of enabling the computer to perform step (i) using the following steps:

(i) assigning a begin state of the behavior state transition graph to a permissible paths list;

(ii) selecting a hitherto unvisited state in the permissible paths list;

(iii) generating a behavior structural RTL (iv) performing uninterpreted symbolic simulation to identify corresponding signals in the schedule structural RTL and the behavior structural RTL;

(v) adding a new copy of state Sj to permissible paths if a conjunction of transition condition and pathsignal is not zero;

(vi) repeating sub-step v for each outgoing transition from Si to Sj; and (vii) repeating steps iii to vi for all unvisited states until only unvisited states remaining in permissible paths list are instance of an end state.

22. The computer system of claim 20 wherein said instructions further comprises instructions capable of enabling the computer to perform step (k) using the following steps for each loop:

(i) identifying three cuts in the structural RTL circuit of the path in the schedule, wherein each cut represents variable values at the boundary of each iteration of the loop;

(ii) identifying the corresponding cuts in the structural RTL circuit of the path in the behavior and checking that the
    subcircuits between the first and second, and second and third cuts are isomorphic;

(iii) identifying equivalence relationships between variables at each pair of corresponding cuts in the schedule and behavioral RTL circuits;

(iv) checking if the equivalence relationships between the latest and its previous cuts are identical;

(v) if the relationships of step (iv) are not identical, and if the equivalence relationship at the latest cut is a subset of the equivalence relationship at the previous cut, discarding the equivalence relationship at the previous cut, unroll the two RTL circuits for one more loop iteration and repeat from step (iii);

(vi) if the relationships of step (iv) are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeat from step (iii);

(vii) if the relationships in step (iv) are identical, adding the equivalence relationship at the latest cut to the set of equivalence relationship sets;

(viii) removing all entries in the set of equivalence relationship sets that are supersets of other entries;

(ix) designating the final set of equivalence relationship sets as the desired set of invariants.

23. A computer program product including a computer readable media comprising computer code that is capable of enabling a computer to check correctness of scheduling of a circuit, where a schedule for the circuit is obtained from a behavioral description, said computer code comprising:

computer code for extracting loop invariants to determine a sufficient set of acyclic threads when loops are present;

computer code for symbolic simulation to extract the loop invariants; and computer code to prove equivalence of the acyclic threads.

24. The computer program product of claim 23 wherein said behavioral description is transformed through introduction of cycle boundaries.

25. The computer program product of claim 23 wherein said behavioral description is transformed through operation reordering.

26. The computer program product of claim 23 wherein said behavioral description is transformed through loop unrolling, winding, folding and pipelining.

27. The computer program product of claim 23 wherein said behavioral description is transformed through speculative execution of operations.

28. A computer program product including a computer readable media comprising computer code that is capable of enabling a computer to verify a schedule of a circuit against a behavioral description of the circuit, said computer code comprising:

a schedule state transition graph generator code for enabling the computer to specify the schedule as a schedule state transition graph;

a behavior state transition graph generator code for enabling the computer to specify the behavior of the circuit as a behavioral state transition graph;

a schedule thread selector code for enabling the computer to select a schedule thread of execution from said schedule state transition graph;

a behavior thread selector code for enabling the computer to select a corresponding behavior thread from said behavioral state transition graph;

a convertor code for enabling the computer to convert said schedule thread into a schedule structure graph and said behavior thread into a behavior structure graph; and an equivalence checker code for enabling the computer to check equivalence of said schedule structure graph and said behavior structure graph.

29. A computer program product including a computer readable media comprising computer code that is capable of enabling a computer to verify a schedule of a circuit against a behavioral description of the circuit, said computer code enabling the computer to perform the following steps:

(a) specifying the schedule as a schedule state transition graph;

(b) representing a behavior of the circuit as a behavioral state transition graph;

(c) selecting a schedule thread of execution from said schedule state transition graph;

(d) identifying a corresponding behavior thread from said behavioral state transition graph;

(e) converting said schedule thread into a schedule structure graph and said behavior thread into a behavior structure graph;

(f) checking equivalence of said schedule structure graph and said behavior structure graph; and (g) repeating steps (c)–(f) for all threads of execution.

30. The method of claim 29 wherein said computer code is capable of enabling the computer to perform step (f) using the following steps:

(i) creating ordered set arr1 containing all nodes in said behavior structure graph such that each node in said behavior state transition graph appears only after all nodes in the transitive fanin of said each node;

(ii) creating ordered set arr2 containing all nodes in said schedule structure graph such that each node in said behavior structure graph appears only after all nodes in the transitive fanin of said each node;

(iii) traversing arr1 and identifying basis variables in the behavior structure graph;

(iv) expressing non-basis variables in the behavior structure graph in terms of basis variables;

(v) constructing equivalence lists for input nodes in the schedule structure graph;

(vi) traversing arr2 and processing each node in arr2 to propagate equivalence lists from an input of the schedule
   structures graph to output of the schedule structure graph, wherein an entry in each of said equivalence lists is a pair (u,c) where u is an identifier for a signal in the behavior structure graph and c is a binary decision diagram representing a condition for equivalence;

(vii) checking if an equivalence has been established with a corresponding out node in the behavior structure graph and if a corresponding condition c is a tautology for a primary output node in arr2; and (viii) repeating step (vii) for all output nodes in arr2; and (ix) finding equivalence if all output nodes are found to be equivalent.

31. A computer program product including a computer readable media comprising computer code that is capable of enabling a computer to verify a equivalence between a schedule of a circuit and a behavior of said circuit, wherein said schedule and said behavior could have cyclic threads of execution, said computer code enabling the computer to perform the following steps:

(a) representing the schedule as a schedule state transition graph;

(b) representing the behavior as a behavior state transition graph;

(c) identifying strongly connected components in the schedule state transition graph;

(d) identifying exit nodes in each of said strongly connected components;

(e) collapsing said schedule state transition graph to merge subpaths that do not pass through said strongly connected components;

(f) selecting a hitherto unselected path;

(g) obtaining a structural RTL circuit for the path selected in step (f);

(h) adding circuitry to the structural RTL circuit for generating a pathsignal encapsulating all state transition decisions required to enumerate the selected path;

(i) performing constrained symbolic simulation using the pathsignal to identify a corresponding path in behavior state transition graph, and obtaining a structural RTL circuit for said path;

(j) selecting a hitherto unselected strongly connected component in the selected path;

(k) extracting invariants for the selected strongly connected component in the selected path as a list of correspondence sets;

(l) selecting a correspondence set from the list of correspondence sets;

(m) redoing symbolic simulation if the selected correspondence set is smaller than a variable correspondence obtained at a strongly connected component cut of a prior symbolic simulation;

(n) repeating steps (i)–(m) for all correspondence set in the list of correspondence sets;

(o) testing if an output equivalence condition is conditional on anything other than path conditions;

(p) reporting non-equivalence and exiting this method if said output equivalence is conditional in step o;

(q) repeating steps (j)–(p) for all strongly connected components in the selected path; and (r) repeating steps (f)–(q) for all paths from a root to sink such that any exit point appears at most thrice.

32. The computer program code of claim 31 wherein the computer code is capable of enabling the computer to perform unconstrained symbolic simulation of step (i) using the following steps:

(i) assigning a begin state of the behavior state transition graph to a permissible paths list;

(ii) selecting a hitherto unvisited state in the permissible paths list;

(iii) generating a behavior structural RTL (iv) performing uninterpreted symbolic simulation to identify corresponding signals in the schedule structural RTL and the behavior structural RTL;

(v) adding a new copy of state Sj to permissible paths if a conjunction of transition condition and pathsignal is not zero;

(vi) repeating sub-step v for each outgoing transition from Si to Sj; and (vii) repeating steps iii to vi for all unvisited states until only unvisited states remaining in permissible paths list are instance of an end state.

33. The computer program code of claim 31 wherein the computer code is capable of enabling the computer to extract invariants in step (k) using the following steps for each loop:

(i) identifying three cuts in the structural RTL circuit of the path in the schedule, wherein each cut represents variable values at the boundary of each iteration of the loop;

(ii) identifying the corresponding cuts in the structural RTL circuit of the path in the behavior and checking that the subcircuits between the first and second, and second and third cuts are isomorphic;

(iii) identifying equivalence relationships between variables at each pair of corresponding cuts in the schedule and behavioral RTL circuits;

(iv) checking if the equivalence relationships between the latest and its previous cuts are identical;

(v) if the relationships of step (iv) are not identical, and if the equivalence relationship at the latest cut is a subset of the equivalence relationship at the previous cut, discarding the equivalence relationship at the previous cut, unroll the two RTL circuits for one more loop iteration and repeat from step (iii);

(vi) if the relationships of step (iv) are not identical and if the equivalence relationship at the latest cut is not a subset of the equivalence relationship at the previous cut, adding the equivalence relationship at the previous cut to the set of equivalence relationship sets, unroll the two RTL circuits for one more loop iteration and repeat from step (iii);

(vii) if the relationships in step (iv) are identical, adding the equivalence relationship at the latest cut to the set of equivalence relationship sets;

(viii) removing all entries in the set of equivalence relationship sets that are supersets of other entries; designating the final set of equivalence relationship sets as the desired set of invariants.

* * * * *